United States Patent
Park et al.

(10) Patent No.: US 12,068,583 B2
(45) Date of Patent: Aug. 20, 2024

(54) SURFACE EMITTING LASER DEVICE AND LIGHT EMITTING DEVICE INCLUDING THE SAME

(71) Applicant: SUZHOU LEKIN SEMICONDUCTOR CO., LTD., Taicang (CN)

(72) Inventors: Keun Uk Park, Seoul (KR); Jeong Sik Lee, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 624 days.

(21) Appl. No.: 17/290,086

(22) PCT Filed: Oct. 29, 2019

(86) PCT No.: PCT/KR2019/014379
§ 371 (c)(1),
(2) Date: Apr. 29, 2021

(87) PCT Pub. No.: WO2020/091383
PCT Pub. Date: May 7, 2020

(65) Prior Publication Data
US 2021/0399528 A1 Dec. 23, 2021

(30) Foreign Application Priority Data
Oct. 31, 2018 (KR) .................. 10-2018-0131807

(51) Int. Cl.
*H01S 5/343* (2006.01)
*H01S 5/183* (2006.01)
*H01S 5/34* (2006.01)

(52) U.S. Cl.
CPC ...... *H01S 5/34353* (2013.01); *H01S 5/18361* (2013.01); *H01S 5/3408* (2013.01);
(Continued)

(58) Field of Classification Search
CPC ............. H01S 5/34353; H01S 5/18361; H01S 5/3408; H01S 5/3425; H01S 5/34313;
(Continued)

(56) References Cited

U.S. PATENT DOCUMENTS 5,023,879 A * 6/1991 Wang .................. H01S 5/34313
372/45.01
5,877,509 A * 3/1999 Pau ........................ B82Y 10/00
372/50.11
(Continued)

FOREIGN PATENT DOCUMENTS

| JP | 63-32987 A | 2/1988 |
|---|---|---|
| KR | 10-2004-0093671 A | 11/2004 |
| KR | 10-2012-0118055 A | 10/2012 |

OTHER PUBLICATIONS

International Search Report for PCT/KR2019/014379 mailed on Feb. 11, 2020.

*Primary Examiner* — Vu A Vu
(74) *Attorney, Agent, or Firm* — Birch, Stewart, Kolasch & Birch, LLP

(57) ABSTRACT

An embodiment relates to a surface emitting laser device and a light emitting device including the same. A surface emitting laser device according to the embodiment may include a first reflective layer; an active layer disposed on the first reflective layer; an aperture area disposed on the active layer and including an aperture and an insulating region; and a second reflective layer disposed in the aperture area. The active layer may comprise a plurality of quantum wells, quantum barriers, and intermediate layers disposed between the quantum wells and the quantum barriers. The quantum wells and the quantum barriers may include a ternary material, and the intermediate layers may comprise a binary material.

19 Claims, 16 Drawing Sheets

(52) U.S. Cl.
CPC ........ *H01S 5/3425* (2013.01); *H01S 5/34313* (2013.01); *H01S 5/34366* (2013.01)

(58) Field of Classification Search
CPC .. H01S 5/34366; H01S 5/0014; H01S 5/3407; H01S 5/18311; H01S 5/18394; H01S 2301/176; H01S 5/423
USPC .................................................... 372/45.012
See application file for complete search history.

(56) References Cited

U.S. PATENT DOCUMENTS

| | | | |
|---|---|---|---|
| 6,301,281 B1 | 10/2001 | Deng et al. | |
| 6,748,003 B1 | 6/2004 | Knopp et al. | |
| 6,801,558 B2 | 10/2004 | Burak | |
| 6,922,426 B2 | 7/2005 | Johnson | |
| 6,973,109 B2* | 12/2005 | Fukunaga | H01S 5/34 257/18 |
| 7,269,196 B2* | 9/2007 | Tandon | B82Y 20/00 372/45.01 |
| 7,403,552 B2* | 7/2008 | Botez | H01S 5/3407 977/951 |
| 7,772,615 B2* | 8/2010 | Ledentsov | B82Y 20/00 359/254 |
| 7,829,912 B2* | 11/2010 | Johnson | H01L 29/201 257/101 |
| 8,575,592 B2 | 11/2013 | Bergmann et al. | |
| 9,099,842 B2* | 8/2015 | Cerutti | H01S 5/34 |
| 10,096,974 B2* | 10/2018 | Yabuhara | H01S 5/34313 |
| 2005/0152420 A1 | 7/2005 | Kim | |
| 2006/0023763 A1 | 2/2006 | Farmer et al. | |
| 2009/0020768 A1* | 1/2009 | Butcher | H01L 23/535 257/E33.001 |
| 2012/0236891 A1 | 9/2012 | Johnson et al. | |
| 2012/0236892 A1 | 9/2012 | Johnson et al. | |
| 2014/0211822 A1 | 7/2014 | Fattal et al. | |

* cited by examiner

[Figure 1]
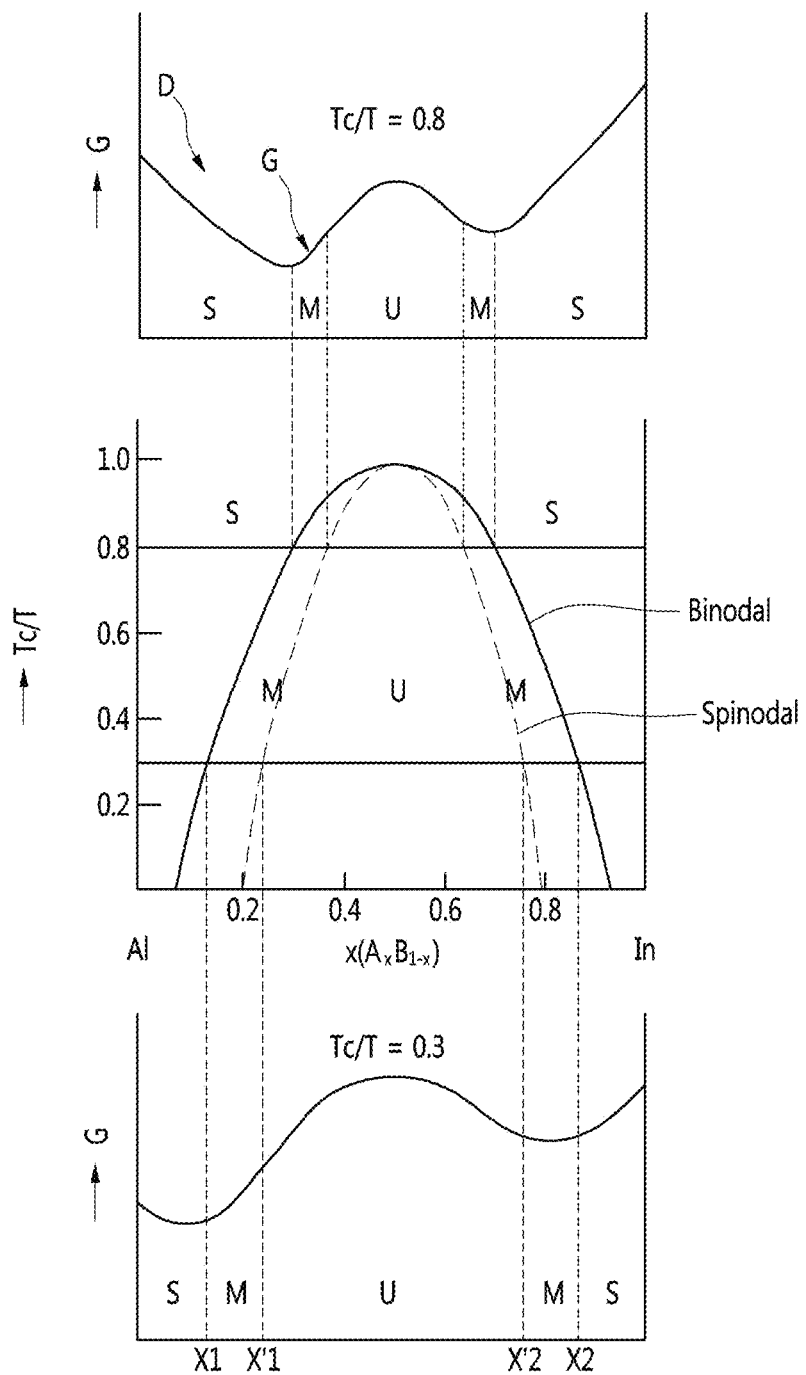

[Figure 2a]
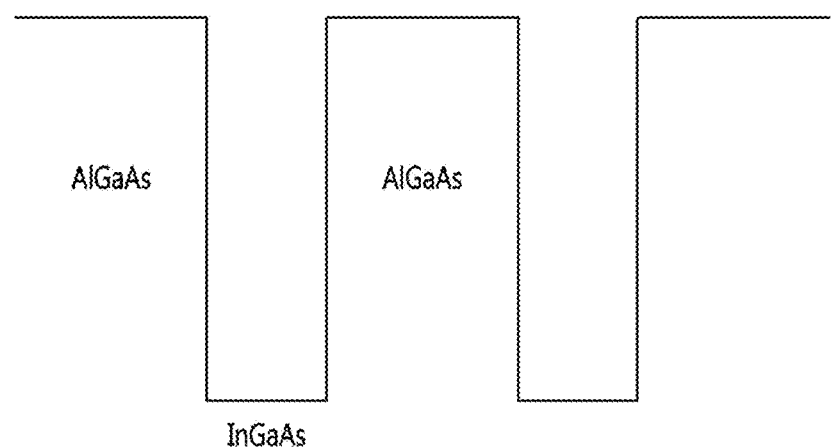
[Figure 2b]
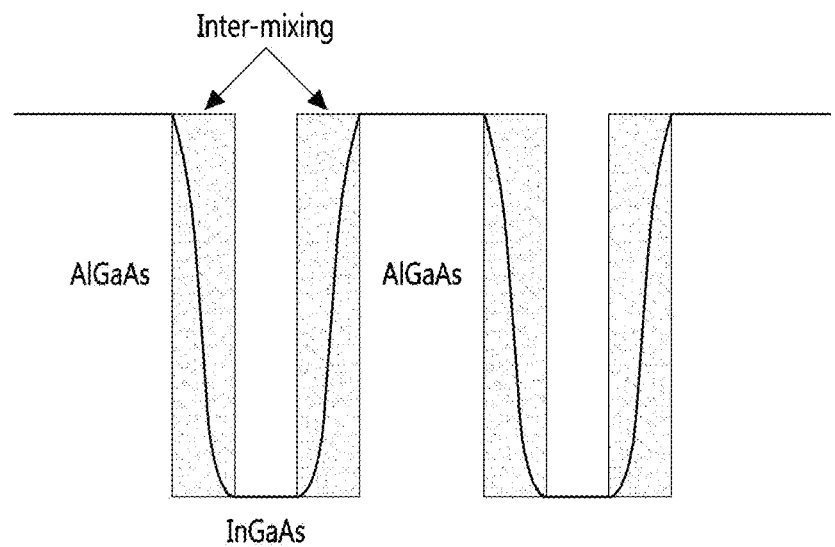

[Figure 3]
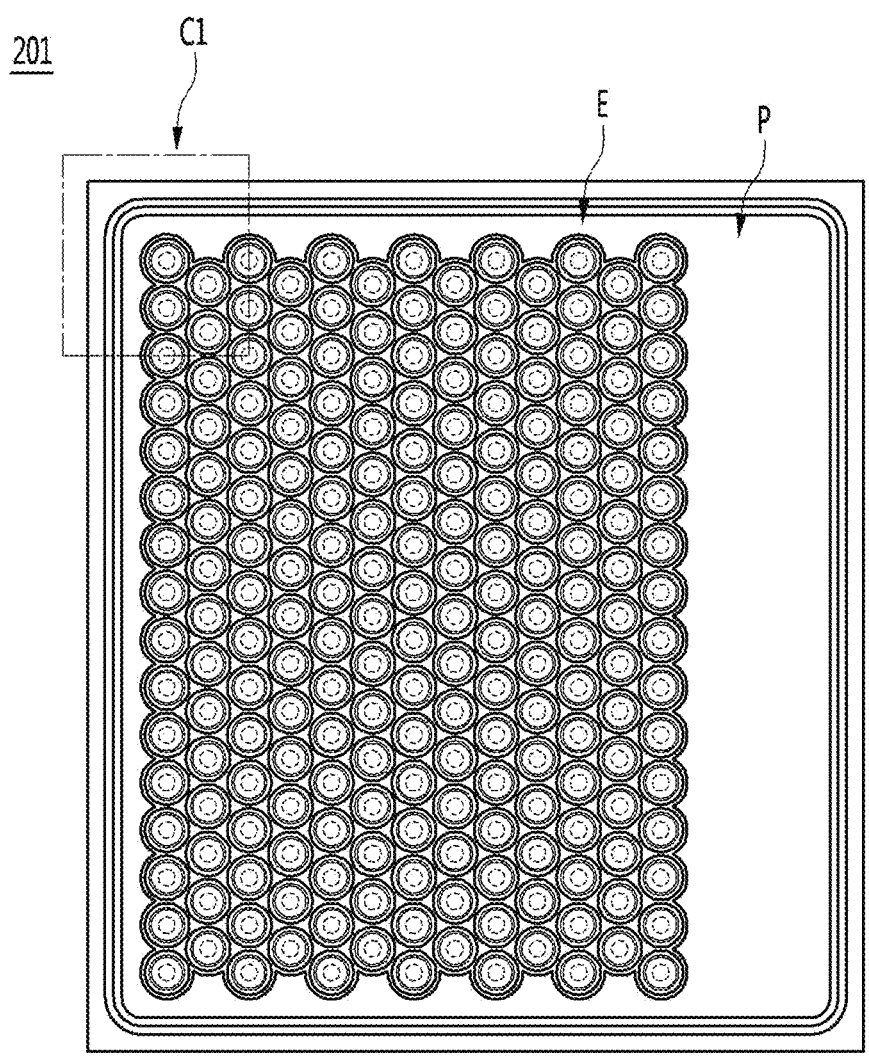

[Figure 4]
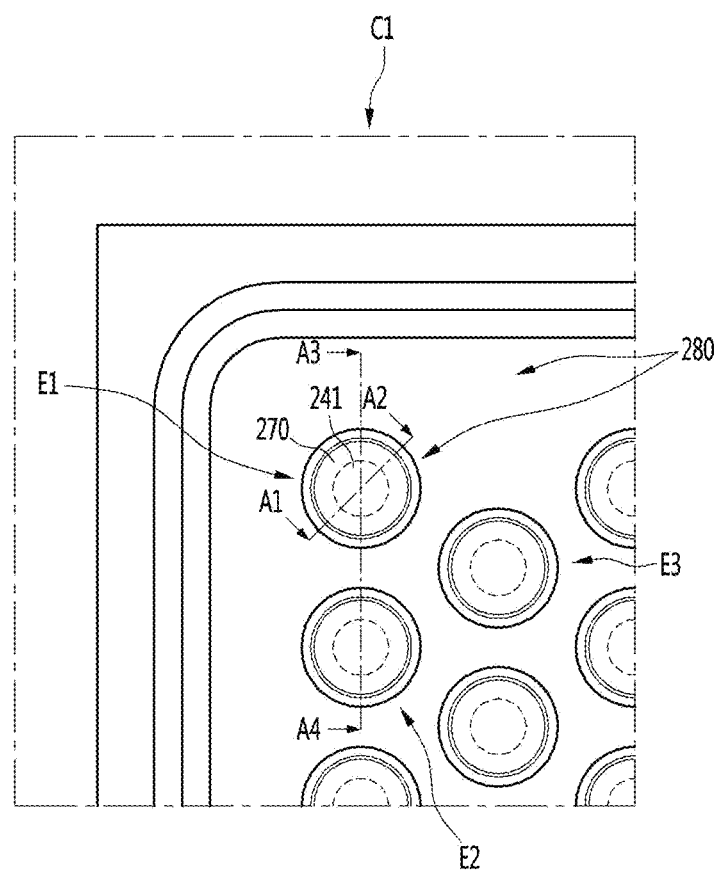

[Figure 5]
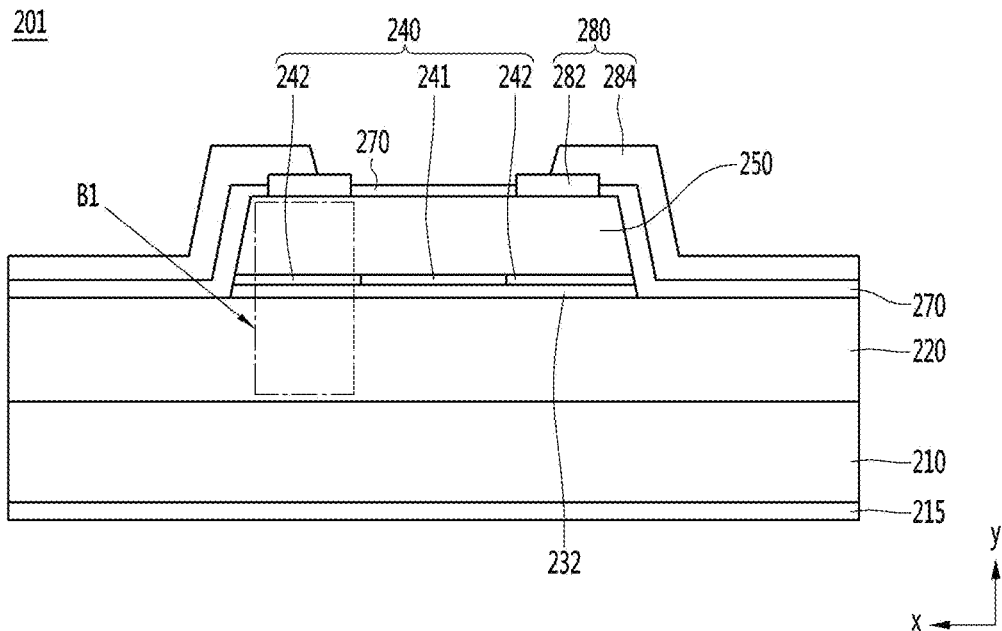
[Figure 6]
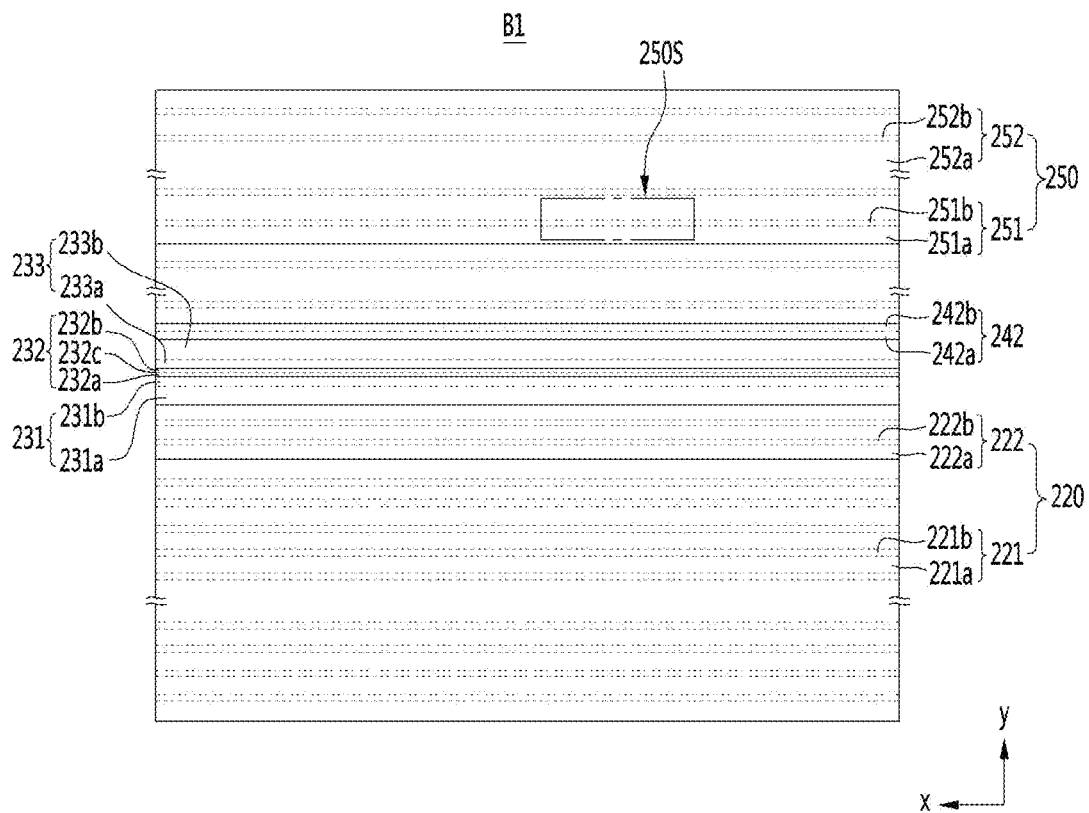

[Figure 7]
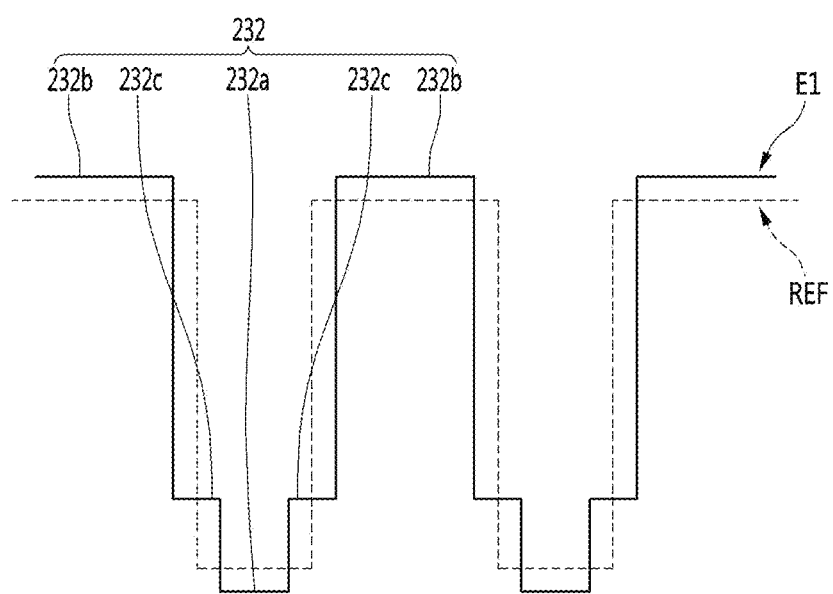

[Figure 8a]
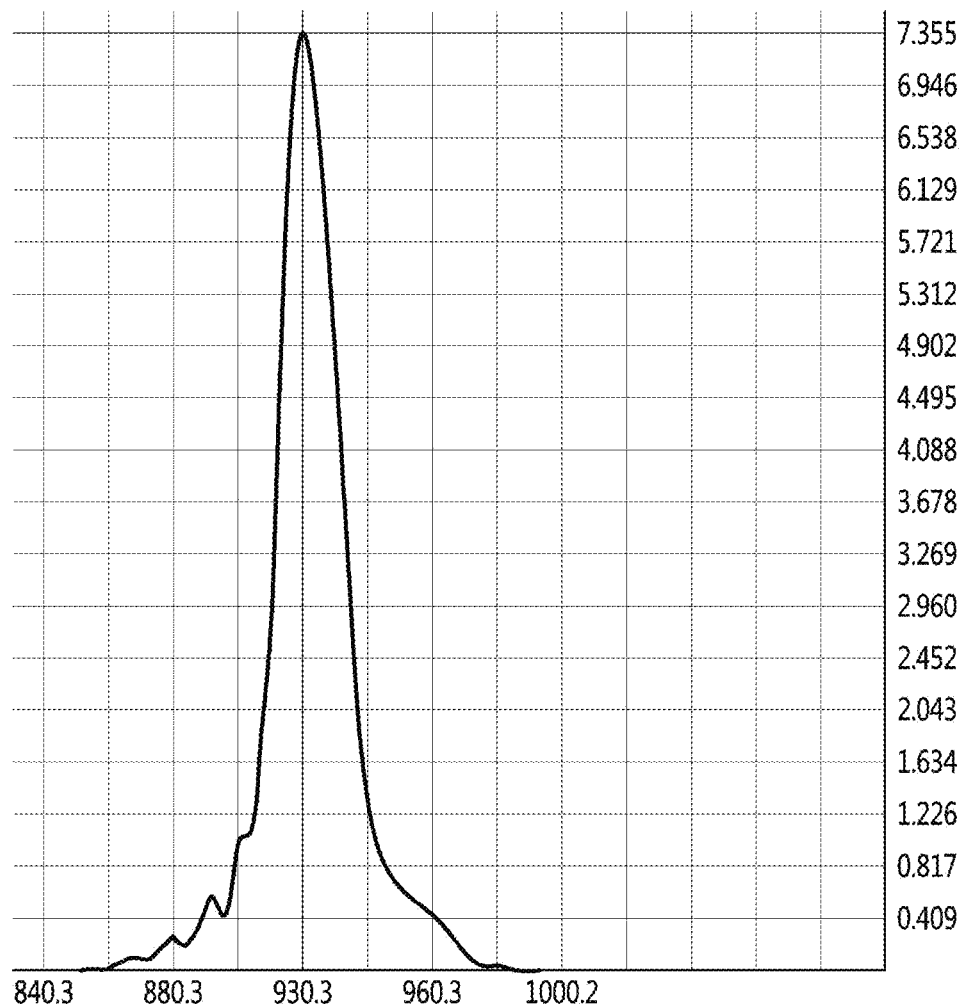

[Figure 8b]
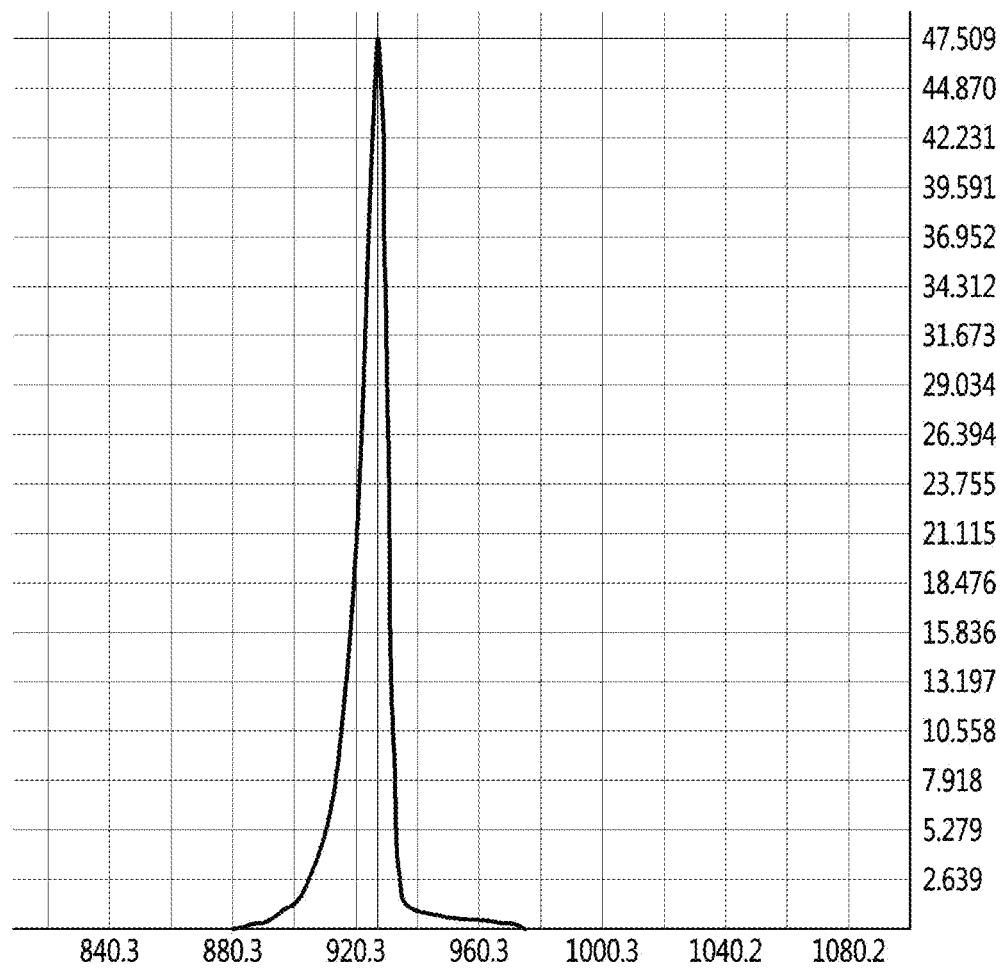

[Figure 9a]
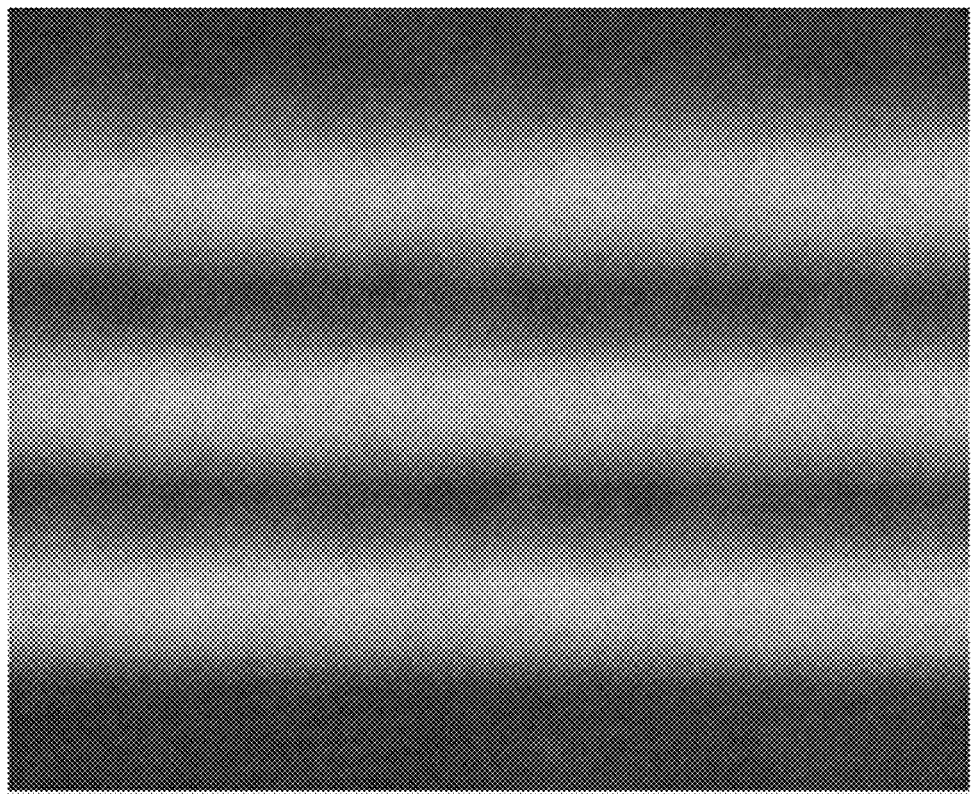

[Figure 9b]
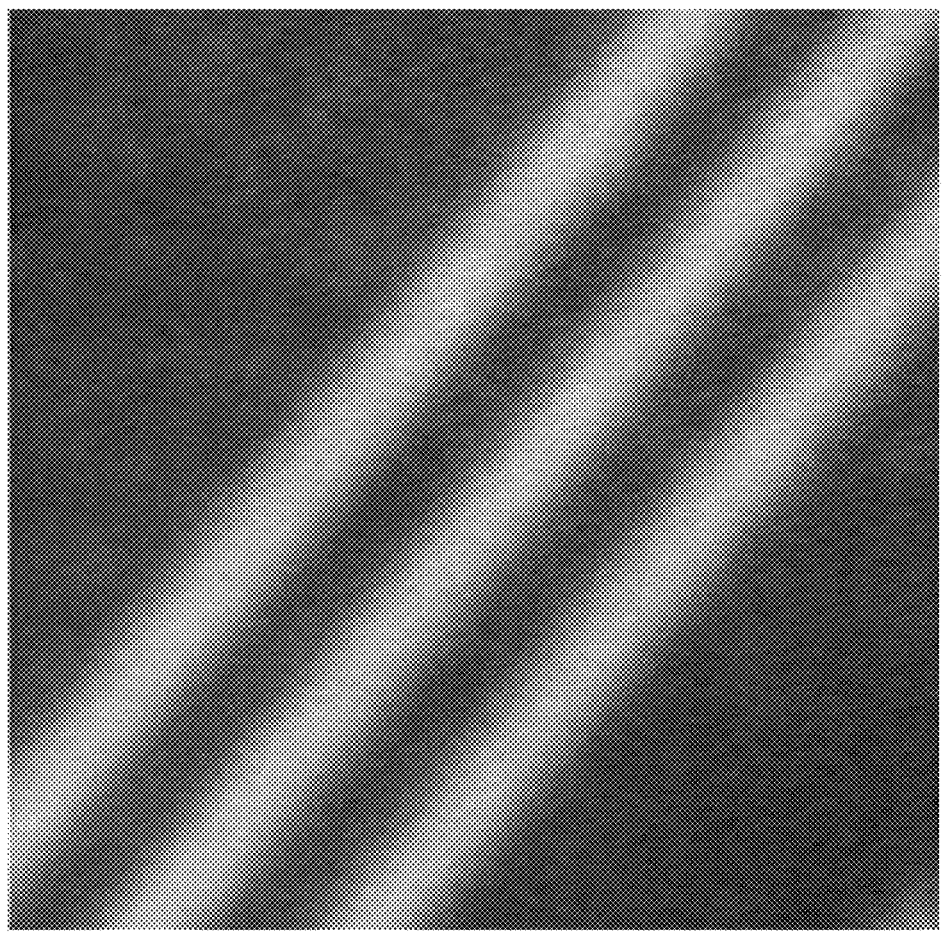
[Figure 10]
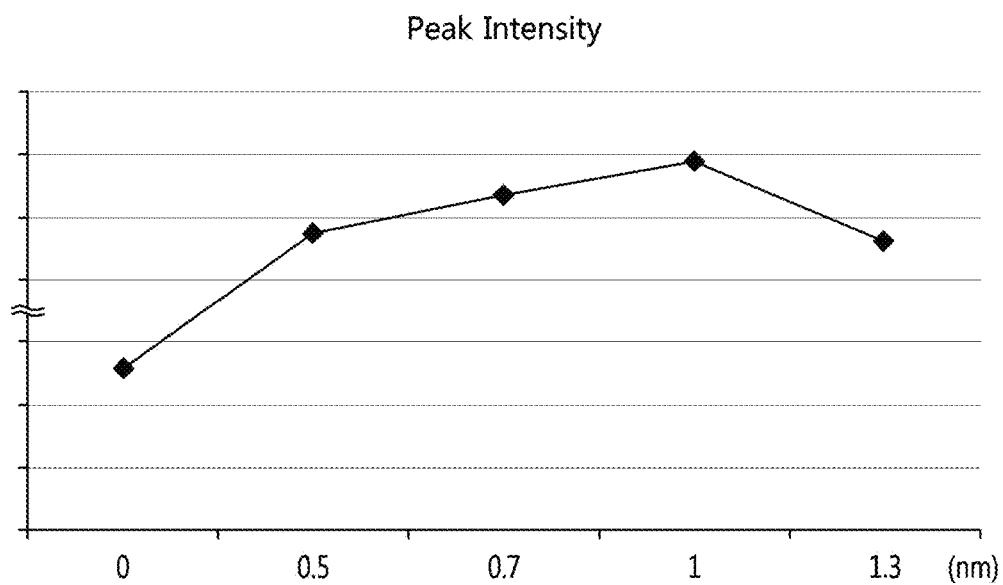

[Figure 11a]
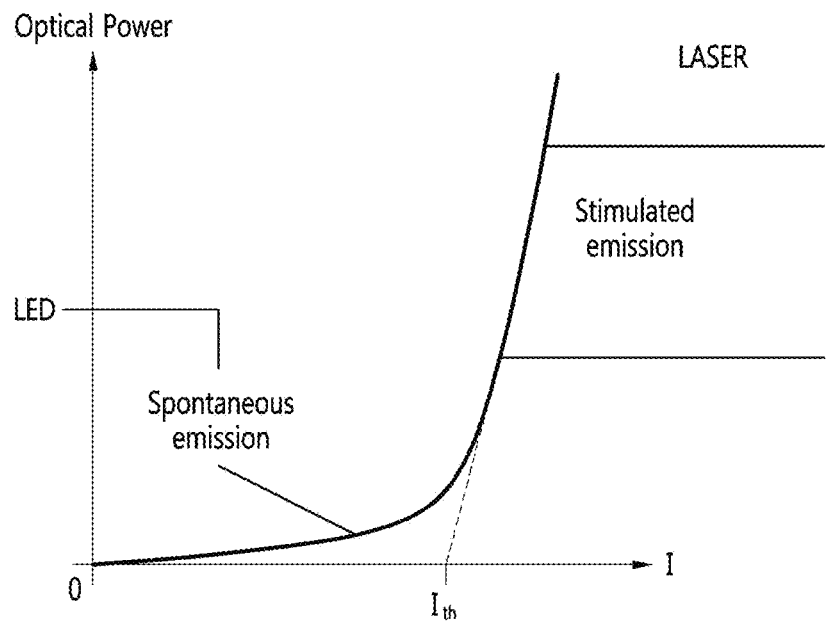
[Figure 11b]
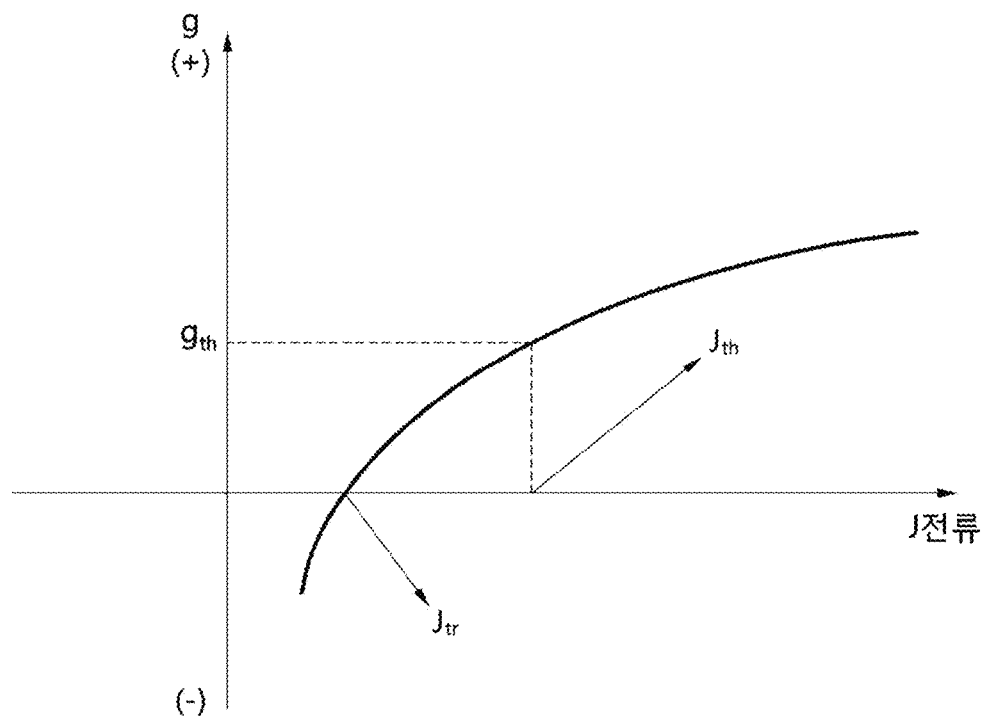

[Figure 11c]
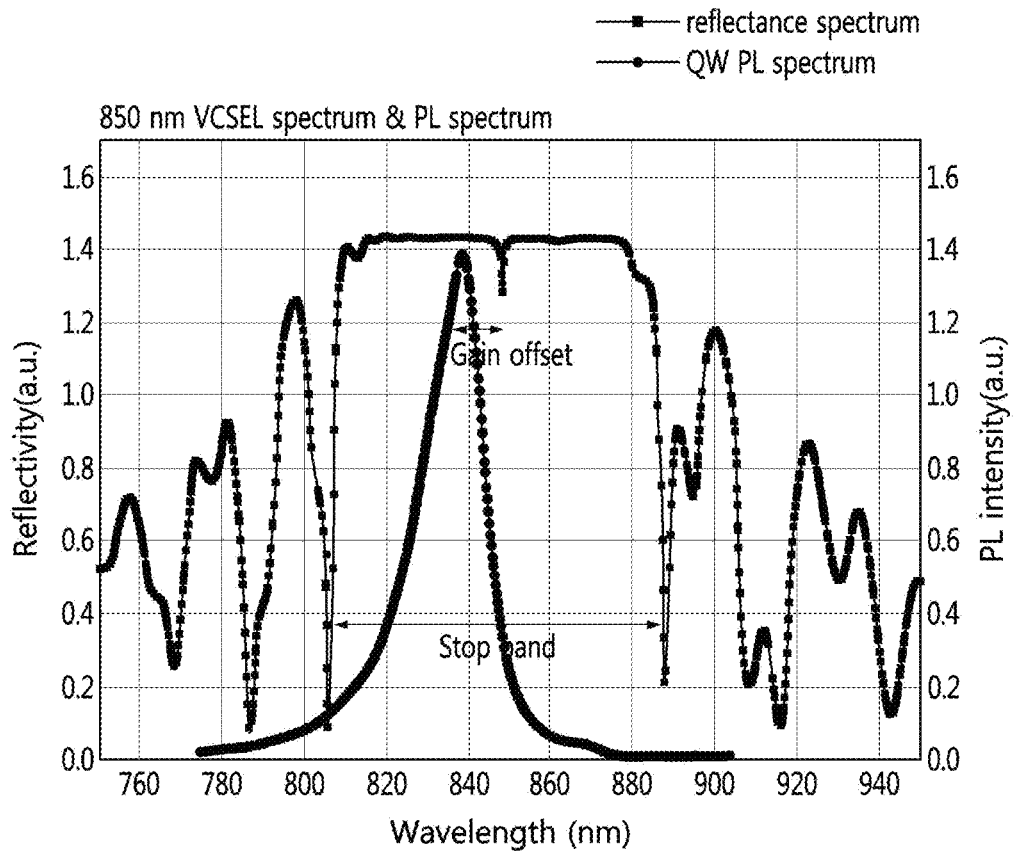
[Figure 12]
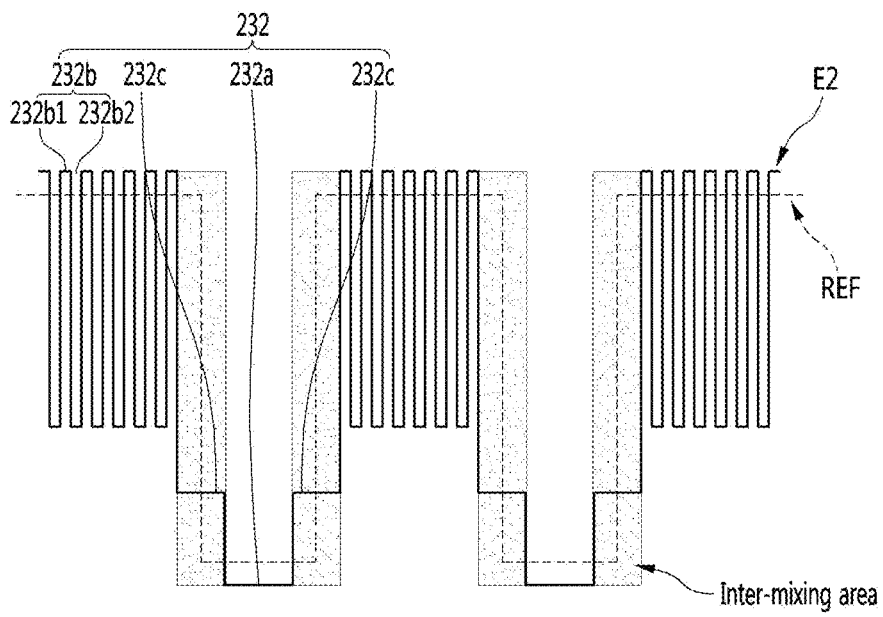

[Figure 13a]
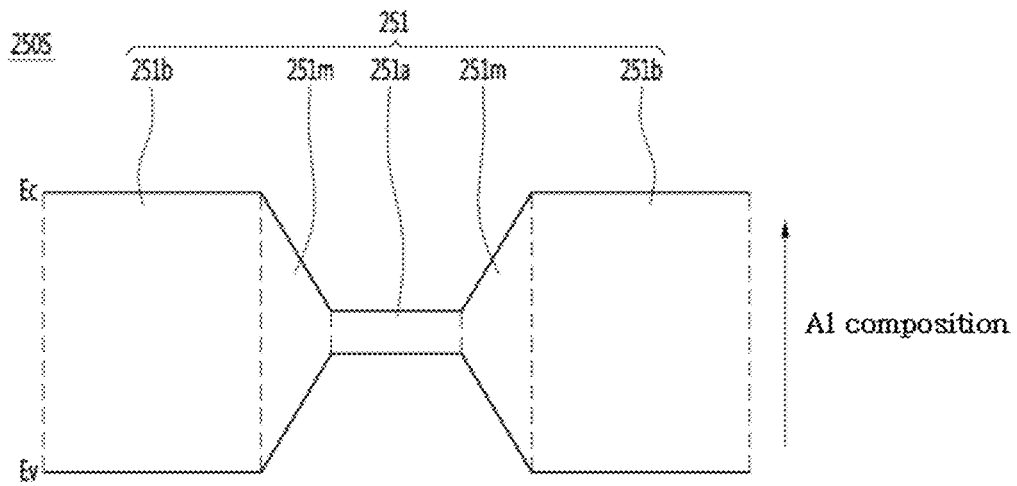
[Figure 13b]
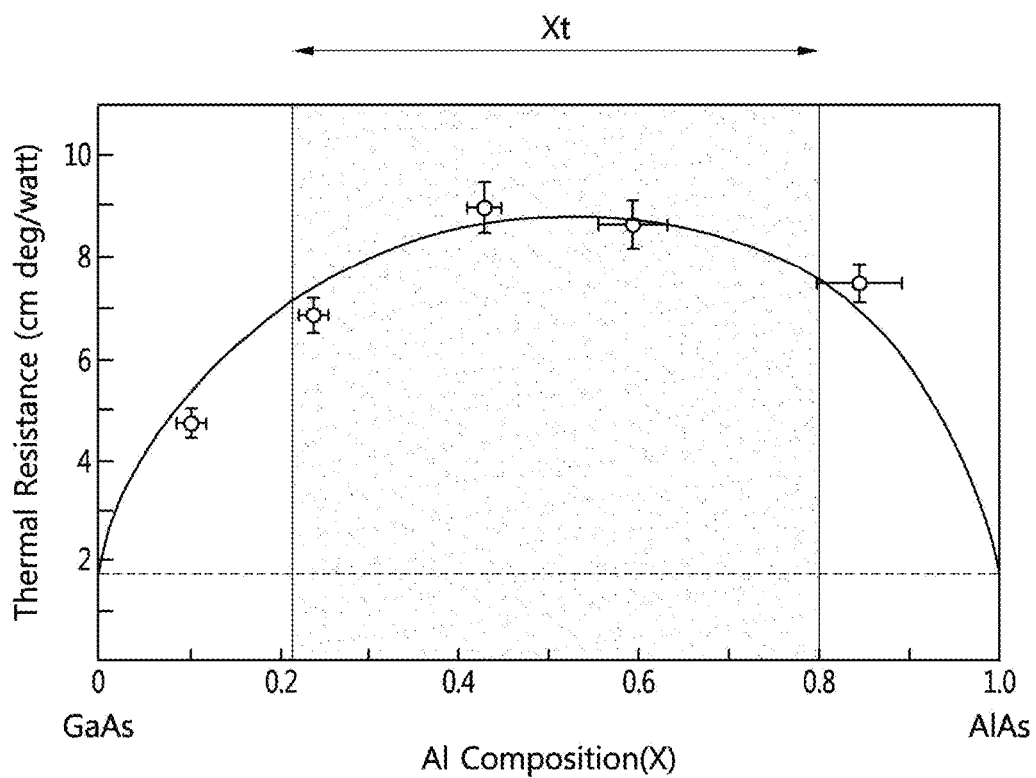

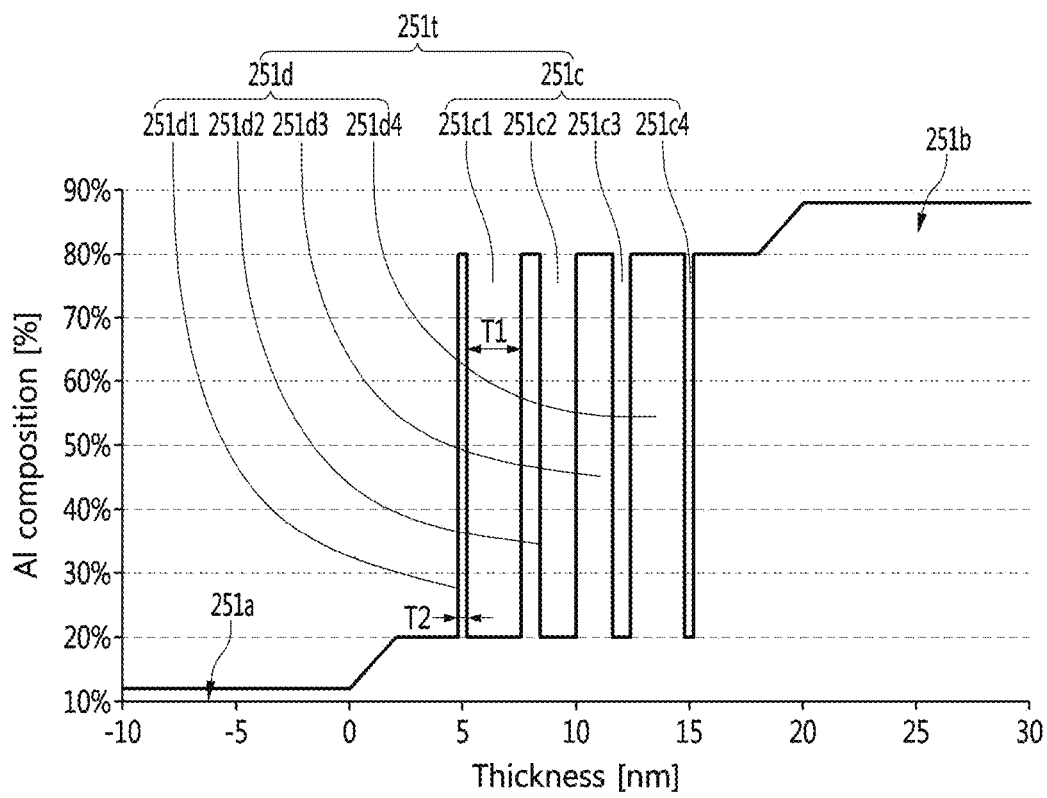
[Figure 14a]

[Figure 14b]
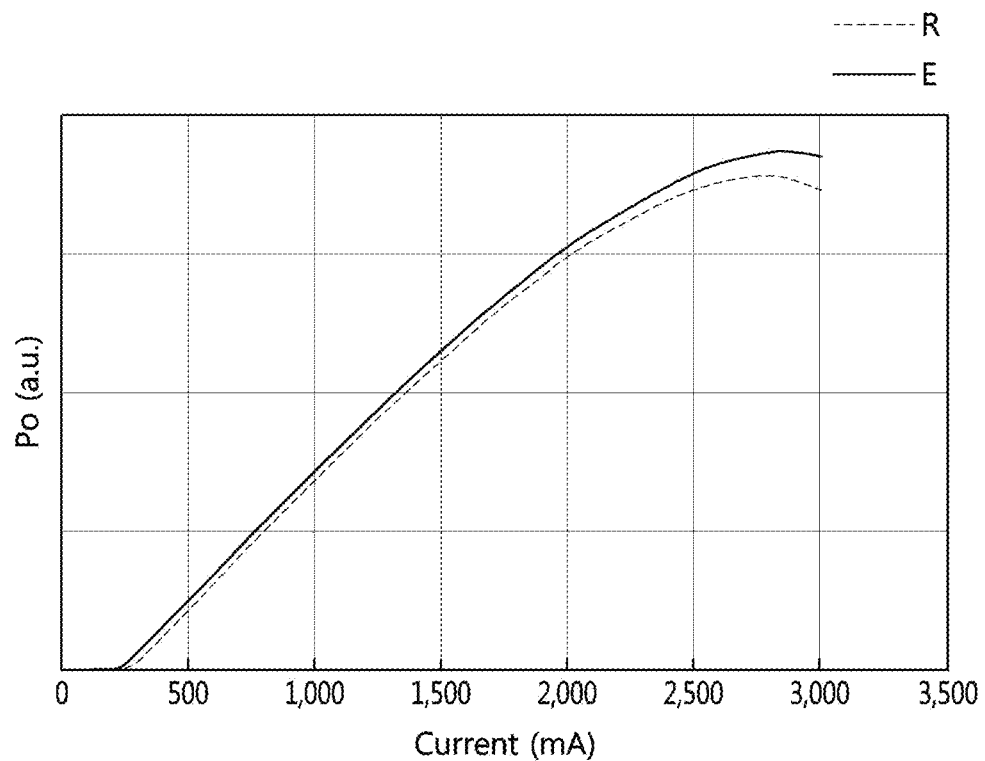
[Figure 15]
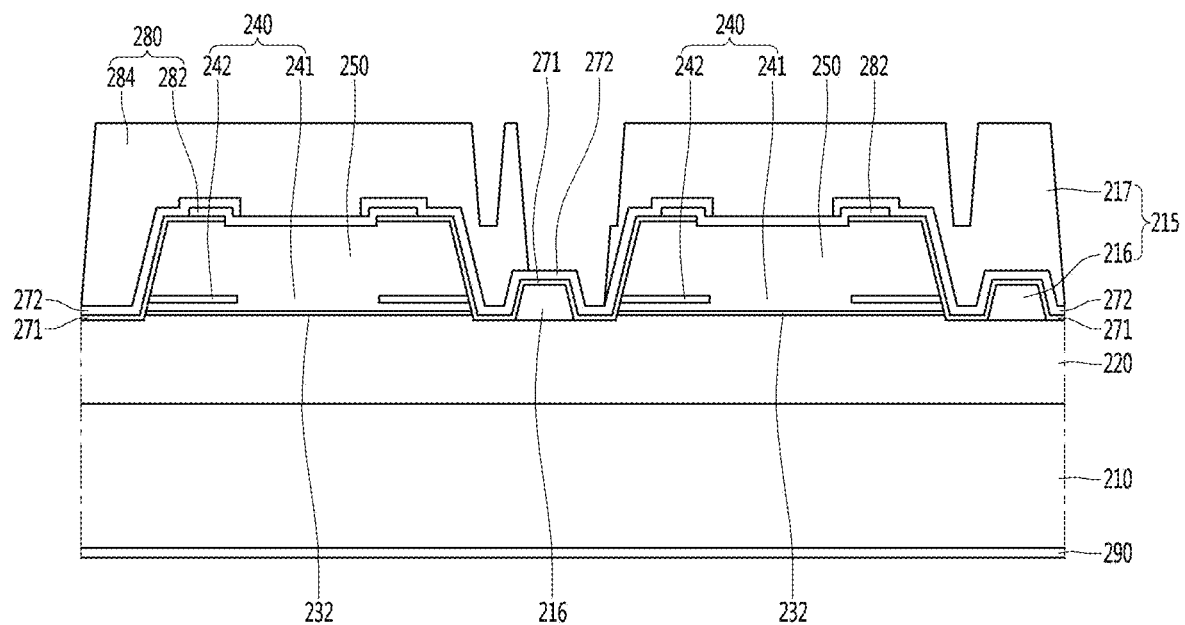

[Figure 16]
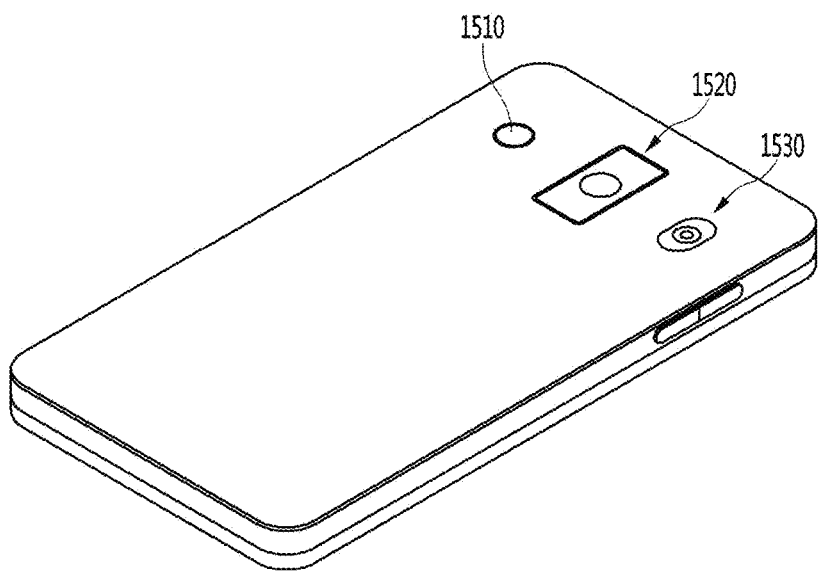

SURFACE EMITTING LASER DEVICE AND LIGHT EMITTING DEVICE INCLUDING THE SAME

CROSS REFERENCE TO RELATED APPLICATIONS

This application is the National Phase of PCT International Application No. PCT/KR2019/014379, filed on Oct. 29, 2019, which claims priority under 35 U.S.C. 119(a) to Patent Application No. 10-2018-0131807, filed in the Republic of Korea on Oct. 31, 2018, all of which are hereby expressly incorporated by reference into the present application.

TECHNICAL FIELD

The embodiment relates to a semiconductor device, and more particularly, to a surface emitting laser device and a light emitting device including the same.

BACKGROUND ART

A semiconductor device including a compound such as GaN or AlGaN has many advantages, such as having a wide and easily adjustable band gap energy, and thus can be used in various ways as a light emitting device, a light receiving device, and various diodes.

In particular, light emitting devices such as light emitting diodes and laser diodes using a group III-V or II-VI compound semiconductor material of semiconductors can be implemented various colors such as blue, red, green, and ultraviolet light. In addition, it is possible to implement highly efficient white light rays by using fluorescent materials or by combining colors. In addition, it has advantages of low power consumption, semi-permanent life, fast response speed, safety and environmental friendliness compared to conventional light sources such as fluorescent lamps and incandescent lamps.

In addition, when light-receiving devices such as photodetectors and solar cells are also manufactured using compound semiconductor materials of Groups III-V or II-VI of semiconductors, the development of device materials generates photocurrent by absorbing light in various wavelength ranges. By doing so, light in various wavelength ranges from gamma rays to radio wavelength ranges can be used. In addition, it has the advantages of fast response speed, safety, environmental friendliness, and easy control of device materials, so it can be easily used for power control or ultra-high frequency circuits or communication modules.

Accordingly, a light-emitting diode backlight is replacing a cold cathode fluorescent lamp (CCFL) constituting a transmission module of an optical communication means and a backlight of a liquid crystal display (LCD) display device. Applications are expanding to white light-emitting diode lighting devices that can replace fluorescent or incandescent bulbs, automobile headlights and traffic lights, and sensors that detect gas or fire.

In addition, applications can be extended to high-frequency application circuits, other power control devices, and communication modules. For example, in the conventional semiconductor light source device technology, there is a vertical-cavity surface-emitting laser (VCSEL), which is used for optical communication, optical parallel processing, and optical connection. On the other hand, in the case of a laser diode used in such a communication module, it is designed to operate at a low current.

Meanwhile, response speed was important in the existing structure for data optical communication, but as it is recently applied to a high power PKG for a sensor, optical output and voltage efficiency become important characteristics.

For example, a 3D sensing camera is a camera capable of capturing depth information of an object, and has recently been in the spotlight in conjunction with augmented reality. On the other hand, for sensing the depth of the camera module, a separate sensor is mounted, and it is divided into two types: Structured Light (SL) method and Time of Flight (ToF) method.

In the structured light (SL) method, a laser of a specific pattern is radiated onto a subject, and the depth is calculated by analyzing the degree of deformation of the pattern according to the shape of the subject surface, and then combining it with a picture taken by an image sensor to obtain a 3D photographing result.

In contrast, the ToF method is a method in which a 3D photographing result is obtained by calculating the depth by measuring the time the laser is reflected off the subject and returning, and then combining it with the picture taken by the image sensor.

Accordingly, the SL method has an advantage in mass production in that the laser must be positioned very accurately, while the ToF technology relies on an improved image sensor, and it is possible to adopt either method or both methods in one mobile phone.

For example, a 3D camera called True Depth can be implemented in the front of a mobile phone in the SL method, and the ToF method can be applied in the rear.

Meanwhile, when a VCSEL is applied to a structured light sensor, a time of flight (ToF) sensor, or a laser diode autofocus (LDAF), it operates at a high current. Accordingly, problems such as a decrease in luminous intensity output or an increase in threshold current occur.

On the other hand, when VCSEL is applied to a structured light sensor, a time of flight (ToF) sensor, or a laser diode autofocus (LDAF), it operates at a high current. Accordingly, problems such as a decrease in luminous intensity output or an increase in threshold current may occur.

Accordingly, unlike LEDs, VCSELs have a very high current density and thus require an ohmic design from a reliability perspective. For example, the current density is about 7-50 A/cm$^2$ in LED, but the current density is about 7000 A/cm$^2$ in VCSEL.

Accordingly, current crowding occurs in which the carrier density at the aperture edge rapidly increases as the VCSEL of the related art is applied from a low current to a high current. As a result, there is a problem in that the current injection efficiency decreases due to the current concentration at the aperture edge.

Meanwhile, in the conventional VCSEL technology, a multiple quantum well (MQW) structure including an InGaAs quantum well (QW) and an AlGaAs quantum barrier (QB) are applied as an active layer in order to oscillate a wavelength of 900 nm or more.

At this time, FIG. 1 is an AlIn(Ga)As phase diagram in the related art. In FIG. 1, the design value (D) and the growth value (G) data deviating from the design value (D) are displayed together.

In addition, FIG. 2A is a band diagram for an active layer design (D), and FIG. 2B is a band diagram for an active layer that is actually grown (G).

According to the prior art, unlike the composition design value (D) of FIGS. 1 and 2A, growth (G) by deviating from the design value (D) as shown in FIGS. 1 and 2B due to the phase separation of the InAlAs alloy occurs. This causes a problem of deterioration of interfacial properties due to inter-mixing between materials of the quantum well and the quantum barrier, leading to a decrease in luminous efficiency and reliability. For example, there is a problem in that high-temperature reliability for thermal characteristics is deteriorated, so that the slope efficiency of the light output (Po) is deteriorated.

In addition, in the related art, there is a problem in that peak intensity is lowered due to an increase in the full width at half maximum (FWHW) due to inter-mixing between the material of the quantum well and the quantum barrier in the active layer.

In addition, DBR, which is a reflective layer in the related art, increases the reflectance by alternately arranging AlGaAs-based materials in different compositions of Al. However, an electric field is generated by energy band bending at the interface between these adjacent DBR layers, and this electric field becomes a carrier barrier and the light output decreases.

On the other hand, according to the un-disclosed internal technology, there is an attempt to lower the electrical resistance at the interface between the DBR layers, but this attempt causes a problem of lowering the optical efficiency due to the increase in thermal resistance in the DBR layer, resulting in a technical contradiction.

DISCLOSURE

Technical Problem

The embodiment is to provide a surface emitting laser device and a light emitting device including the same, capable of improving interfacial characteristics.

In addition, the embodiment is to provide a surface emitting laser device and a light emitting device including the same, capable of improving light-emitting characteristics.

In addition, the embodiment is to provide a surface emitting laser device and a light emitting device including the same, capable of improving electrical characteristics.

In addition, the embodiment is to provide a surface emitting laser device and a light emitting device including the same, which can improve light efficiency by not generating thermal resistance while improving electrical characteristics.

Technical Solution

The surface emitting laser device according to the embodiment may include a first reflective layer 220, an active layer 232 disposed on the first reflective layer 220, an aperture region 240 including an aperture 241 and an insulating region 242 disposed on the active layer 232, and a second reflective layer 250 disposed on the aperture region 240.

The active layer 232 may include a plurality of quantum wells 232a and quantum barriers 232b, and an intermediate layer 232c disposed between the quantum well and the quantum barrier.

The quantum well 232a and the quantum barrier 232b may be made of a ternary material, and the intermediate layer 232c may be made of a binary material.

The material of the intermediate layer 232c may include a material included in the quantum barrier 232b and the quantum well 232a.

The quantum well 232a may include an $In_xGa_{1-x}As$ layer (0<x<1), the quantum barrier 232b may include an $Al_yGa_{1-y}As$ layer (0<y<1), and the intermediate layer 232c may include a GaAs layer.

The active layer 232 may have a superlattice structure including an $In_xGa_{1-x}As$ layer/GaAs layer/$Al_yGa_{1-y}As$ layer.

A thickness of the intermediate layer 232c in the active layer 232 may be 7% to 40% of a thickness of the quantum well 232a.

A thickness of the intermediate layer 232c of the binary material interposed between the quantum well 232a and the quantum barrier 232b in the active layer 232 may be 0.5 nm to 1.3 nm.

The active layer 232 may have a full width at half maximum (FWHM) of 10 nm to 7.0 nm based on a photo luminance (PL) value.

A band gap energy level of the intermediate layer 232c may be higher than a band gap energy level of the quantum well 232a and lower than a band gap energy level of the quantum barrier 232b.

The quantum barrier 232b of the active layer 232 may have a superlattice structure of a first quantum barrier layer 232b1 and a second quantum barrier layer 232b2.

In the quantum barrier 232b, the first quantum barrier layer 232b1 may include an $Al_yGa_{1-y}As$ layer (0<y<1), and the second quantum barrier layer 232b2 may include $In_zAl_yGa_{1-y-z}As$ layer (0<y<1, 0<z<1).

The second reflective layer 250 may include a first AlGaAs-based layer 251a including $Al_{x1}Ga_{(1-x1)}As$ (where 0<X1<0.2); a second AlGaAs-based layer 251b disposed on the first AlGaAs-based layer 251a including $Al_{x2}Ga_{(1-x2)}As$ (where, 0.8<X2<1.0); and an AlGaAs-based transition region 251t disposed between the first AlGaAs-based layer 251a and the second AlGaAs-based layer 251b.

The AlGaAs-based transition region 251t may include a third AlGaAs-based layer 251c including $Al_{x3}Ga_{(1-x3)}As$ (however, 0<X3<0.2); and a fourth AlGaAs-based layer 251d including $Al_{x4}Ga_{(1-x4)}As$ (however, 0.8<X4<1.0).

The third AlGaAs-based layer 251c and the fourth AlGaAs-based layer 251d may be alternately disposed in a plurality of layers.

The plurality of third AlGaAs-based layers 251c may be thinner in a direction from the first AlGaAs-based layer 251a to the second AlGaAs-based layer 251b.

The plurality of fourth AlGaAs-based layers 251d may be thinner in a direction from the second AlGaAs-based layer 251b to the first AlGaAs-based layer 251a.

The light emitting device of the embodiment may include the surface emitting laser device.

Advantageous Effects

The embodiment can provide a surface emitting laser device and a light emitting device including the same, capable of improving interfacial characteristics.

In addition, the embodiment may provide a surface emitting laser device and a light emitting device including the same, capable of improving light-emitting characteristics.

In addition, the embodiment may provide a surface emitting laser device and a light emitting device including the same, capable of improving electrical characteristics.

In addition, the embodiment can provide a surface emitting laser device and a light emitting device including the same, which can improve light efficiency by not generating thermal resistance while improving electrical characteristics.

DESCRIPTION OF DRAWINGS

FIG. 1 is an AlIn(Ga)As phase diagram in the related art.

FIG. 2a is a band diagram for the design of the active layer in the related art.

FIG. 2b is a band diagram of an active layer actually grown in the related art.

FIG. 3 is a plan view of a surface emitting laser device according to an embodiment.

FIG. 4 is an enlarged view of a portion C1 of the surface emitting laser device according to the embodiment shown in FIG. 3.

FIG. 5 is a first cross-sectional view taken along line A1-A2 of the surface emitting laser device according to the embodiment shown in FIG. 4.

FIG. 6 is a cross-sectional view of a portion B1 of an epi region of the surface emitting laser device according to the embodiment shown in FIG. 5.

FIG. 7 is an energy band diagram of an active layer of the surface emitting laser device according to the first embodiment shown in FIG. 5.

FIG. 8A is a full width at half maximum and optical power (Intensity) data of a surface emitting laser device according to a comparative example.

FIG. 8B is a full width at half maximum and optical power (Intensity) data of the surface emitting laser device according to the embodiment.

FIG. 9A is a TEM photograph of an active layer of a surface emitting laser device according to a comparative example.

FIG. 9B is a TEM photograph of an active layer of a surface emitting laser device according to an embodiment.

FIG. 10 is a peak intensity data in the surface emitting laser device according to the embodiment.

FIG. 11A is a light emission and emission characteristic data of an LED and a LASER, respectively.

FIG. 11B is a diagram illustrating a relationship between an applied current and a gain spectrum for laser oscillation.

FIG. 11C is a diagram showing a relationship between a VCSEL spectrum and a PL spectrum.

FIG. 12 is an energy band diagram of an active layer of a surface emitting laser device according to a second embodiment.

FIG. 13A is a first energy band diagram for a first region 250S of a second reflective layer of a surface emitting laser device according to an embodiment.

FIG. 13B is data of thermal resistance according to Al composition in a second reflective layer of a surface emitting laser device.

FIG. 14A is a partially enlarged view of a second reflective layer of a surface emitting laser device according to an embodiment.

FIG. 14B is a surface emitting laser device according to an embodiment and optical power data according to an applied current of a comparative example.

FIG. 15 is another cross-sectional view of a surface emitting laser device according to an embodiment.

FIG. 16 is a perspective view of a mobile terminal to which a surface emitting laser device is applied according to an embodiment.

MODE FOR INVENTION

Hereinafter, preferred embodiments of the present invention will be described in detail with reference to the accompanying drawings. However, the technical idea of the present invention is not limited to some embodiments to be described, but may be implemented in various different forms, and within the scope of the technical idea of the present invention, one or more of the constituent elements may be selectively combined or substituted between embodiments.

In addition, terms (including technical and scientific terms) used in the embodiments of the present invention have a meaning that can be generally understood by those of ordinary skill in the technical field to which the present invention belongs unless explicitly defined and described. In addition, commonly used terms, such as terms defined in the dictionary, may be interpreted in consideration of the meaning of the context of the related technology.

In addition, terms used in the embodiments of the present invention are for describing the embodiments and are not intended to limit the present invention.

In this specification, the singular form may also include the plural form unless specifically stated in the phrase, and when described as "and at least one (or more than one) of B and C", it may be combined with A, B, and C. It can contain one or more of all possible combinations.

In addition, in describing the constituent elements of the embodiments of the present invention, terms such as first, second, A, B, (a), and (b) may be used. These terms are only for distinguishing the component from other components, and are not limited to the nature, order, or order of the component by the term.

And, when a component is described as being 'connected', 'coupled' or 'contacted' to another component, the component is not only directly connected, coupled, or contacted to the other component, but also another component between the other components may also be included.

In addition, when it is described as being formed or disposed in the "top (up) or bottom (down)" of each component, the top (up) or bottom (down) is one as well as when the two components are in direct contact with each other and it also includes the case where the above other component is formed or disposed between the two components.

In addition, when expressed as "upper (above) or lower (below)", the meaning of not only an upward direction but also a downward direction based on one component may be included.

First Embodiment

FIG. 3 is a plan view of the surface emitting laser device 201 according to the first embodiment, and FIG. 4 is an enlarged view of a portion C1 of the surface emitting laser device according to the embodiment shown in FIG. 3.

Referring to FIG. 3, the surface emitting laser device 201 according to the embodiment may include a light emitting part E and a pad part P, and the light emitting part E may include a plurality of light emitting emitters E1, E2, and E3 as shown in FIG. 4 and may be include tens to hundreds of light emitting emitters.

Referring to FIG. 4, in the embodiment, in the surface emitting laser device 201, a second electrode 280 can be disposed in an area other than the aperture 241 which is an opening, and a passivation layer may be disposed on a surface corresponding to the aperture 241. 270.

Next, FIG. 5 is a cross-sectional view along line A1-A2 of the surface emitting laser device according to the embodiment shown in FIG. 3, and FIG. 6 is an enlarged cross-sectional view of (B1) of an epi region of the surface emitting laser device according to the embodiment shown in FIG. 5.

Referring to FIG. 5, in the embodiment, the surface emitting laser device 201 may include any one or more of a first electrode 215, a substrate 210, a first reflective layer 220, an active layer 232, an aperture area 240, a second of the reflective layer 250, a second electrode 280, and a passivation layer 270.

The aperture region 240 may include an aperture 241 that is opening, and an insulating region 242. The insulating region 242 serves as a current blocking function and may be referred to as an oxide layer, and the aperture region 240 may be referred to as an oxidation region, but is not limited thereto.

The second electrode 280 may include a contact electrode 282 and a pad electrode 284.

Hereinafter, the technical features of the surface emitting laser device 201 according to the embodiment will be described with reference to FIGS. 5 and 6, and the technical effects will be described with reference to the accompanying drawings. In the drawings of the embodiment, the x-axis direction may be a direction parallel to the length direction of the substrate 210, and the y-axis may be a direction perpendicular to the x-axis.

<Substrate, First Electrode>

First, referring to FIG. 5, in the embodiment, the substrate 210 may be a conductive substrate or a non-conductive substrate. When a conductive substrate is used, a metal having excellent electrical conductivity can be used, and since it could sufficiently dissipate heat generated when the surface emitting laser device 201 is operated, a GaAs substrate or a metal substrate or silicon (Si) substrate and the like having high thermal conductivity can be used. When using a non-conductive substrate, an AlN substrate, a sapphire ($Al_2O_3$) substrate, or a ceramic-based substrate may be used.

The substrate 210 shown in FIG. 5 may be a substrate doped with an n-type conductivity type, but embodiments are not limited thereto.

In an embodiment, the first electrode 215 may be disposed under the substrate 210, and the first electrode 215 may be disposed as a single layer or multiple layers of a conductive material. For example, the first electrode 215 may be a metal, and at least one of aluminum (Al), titanium (Ti), chromium (Cr), nickel (Ni), copper (Cu), and gold (Au) and it can be formed in a single-layer or multi-layer structure to improve electrical properties, thereby increasing light output. Since the first electrode 215 can function as an electrode for the first reflective layer 220 functioning as an n-type reflective layer, it may be referred to as an n-type electrode, but the first electrode 215 itself does not contain a doped conductive element.

<First Reflective Layer, Second Reflective Layer>

Next, referring to FIG. 6, the first reflective layer 220 may be doped with a first conductivity type dopant. The first conductivity-type dopant may include an n-type dopant such as Si, Ge, Sn, Se, and Te.

In addition, the first reflective layer 220 may include a gallium-based compound, for example, AlGaAs, but is not limited thereto. The first reflective layer 220 may be a Distributed Bragg Reflector (DBR). For example, the first reflective layer 220 may have a structure in which a first layer and a second layer made of materials having different refractive indices are alternately stacked at least once or more.

For example, as shown in FIG. 6, the first reflective layer 220 includes a first group first reflective layer 221 disposed on the substrate 210 and a second group of first reflective layers 222 disposed on the first group reflective layer 221.

The first group first reflective layer 221 and the second group first reflective layer 222 may include a plurality of layers made of a semiconductor material having a composition formula of $Al_xGa_{(1-x)}As(0<x<1)$. In addition, when Al in each layer increases, the refractive index of each layer decreases, and when Ga increases, the refractive index of each layer may increase.

In addition, a thickness of each layer may be $\lambda/4n$, $\lambda$ may be a wavelength of light generated from the active layer 232, and n may be a refractive index of each layer with respect to light of the above-described wavelength. Here, $\lambda$ may be 650 to 980 nanometers (nm), and n may be the refractive index of each layer. The first reflective layer 220 having such a structure may have a reflectance of 99.999% for light in a wavelength region of about 940 nanometers.

The thickness of the layer in each of the first reflective layers 220 may be determined according to a respective refractive index and a wavelength $\lambda$ of light emitted from the active layer 232.

In addition, as shown in FIG. 6, the first group first reflective layer 221 and the second group first reflective layer 222 may be formed of a single layer or a plurality of layers, respectively.

For example, the first group first reflective layer 221 may include about 30 to 40 pairs of the first group first-first layer 221a and the first group first-second layer 221b. The first group first-first layer 221a may be formed to be thicker than the first group first-second layer 221b. For example, the first group first-first layer 221a may be formed to be about 40 to 60 nm, and the first group first-second layer 221b may be formed to be about 20 to 30 nm.

In addition, the second group first reflective layer 222 may also include about 5 to 15 pairs of the second group first-first layer 222a and the second group first-second layer 222b. The second group first-first layer 222a may be formed to be thicker than the second group first-second layer 222b. For example, the second group first-first layer 222a may be formed to be about 40 to 60 nm, and the second group first-second layer 222b may be formed to be about 20 to 30 nm.

In addition, as shown in FIG. 6, the second reflective layer 250 may include a gallium-based compound, for example, AlGaAs, and the second reflective layer 250 may be doped with a second conductivity type dopant.

For example, the second conductivity-type dopant may be a p-type dopant such as Mg, Zn, Ca, Sr, Ba, or the like.

The second reflective layer 250 may also be a Distributed Bragg Reflector (DBR). For example, the second reflective layer 250 may have a structure in which a plurality of layers made of materials having different refractive indices are alternately stacked at least once.

Each layer of the second reflective layer 250 may include AlGaAs, and in detail, may be formed of a semiconductor material having a composition formula of $Al_xGa_{(1-x)}As$ $(0<x<1)$. Here, when Al increases, the refractive index of each layer decreases, and when Ga increases, the refractive index of each layer may increase. In addition, the thickness of each layer of the second reflective layer 250 is $\lambda/4n$, $\lambda$ may be a wavelength of light emitted from the active layer, and n may be a refractive index of each layer with respect to the light of the above-described wavelength.

The second reflective layer 250 having such a structure may have a reflectance of 99.9% for light in a wavelength region of about 940 nanometers.

The second reflective layer 250 may be formed by alternately stacking layers, and the number of pairs of layers in the first reflective layer 220 may be greater than the number of pairs of layers in the second reflective layer 250. In this case, as described above, the reflectance of the first reflective layer 220 is about 99.999%, which may be greater than the reflectance of 99.9% of the second reflective layer 250.

In an embodiment, the second reflective layer 250 may include a first group second reflective layer 251 disposed adjacent to the active layer 232 and a second group second reflective layer 252 disposed to be spaced apart from the active layer 232 than the first group second reflective layer 252.

As shown in FIG. 6, the first group second reflective layer 251 and the second group second reflective layer 252 may also be formed of a single layer or a plurality of layers, respectively.

For example, the first group second reflective layer 251 may include about 1 to 5 pairs of the first group second-first layer 251a and the first group second-second layer 251b. The first group second-first layer 251a may be formed to be thicker than the first group second-second layer 251b. For example, the first group second-first layer 251a may be formed to be about 40 to 60 nm, and the first group second-second layer 251b may be formed to be about 20 to 30 nm.

In addition, the second group second reflective layer 252 may also include about 5 to 15 pairs of the second group second-first layer 252a and the second group second-second layer 252b. The second group second-first layer 252a may be formed to be thicker than the second group second-second layer 252b. For example, the second group second-first layer 252a may be formed to be about 40 to 60 nm, and the second group second-second layer 252b may be formed to be about 20 to 30 nm.

<Active Layer>

With continued reference to FIG. 6, the active layer 232 may be disposed between the first reflective layer 220 and the second reflective layer 250.

The active layer 232 may include any one of a single well structure, a multiple well structure, a single quantum well structure, a multi quantum well (MQW) structure, a quantum dot structure, or a quantum wire structure.

The active layer 232 may include a well layer 232a, a barrier layer 232b, and an intermediate layer 232c using a compound semiconductor material of a group III-V element. The well layer 232a may be formed of a material having an energy band gap smaller than the energy band gap of the barrier layer 232b. The active layer 232 may not be doped with a dopant.

Technical characteristics of the active layer 232 of the embodiment will be described in more detail later.

<Cavity>

In an embodiment, predetermined cavities 231 and 233 may be disposed between the first reflective layer 220 and the second reflective layer 250.

In addition, the first reflective layer 220 or the second reflective layer 230 may include the cavities 231 and 233.

In an embodiment, the cavity may be disposed above and below the active layer 232 in contact with each other. In addition, the cavity may include a first cavity 231 disposed between the active layer 232 and the first reflective layer 220 and a second cavity 233 disposed between the active layer 232 and the second reflective layer 250.

The first cavity 231 and the second cavity 233 may be formed of an $Al_yGa_{(1-y)}As(0<y<1)$ material, but are not limited thereto. For example, the first cavity 231 and the second cavity 233 may each include a plurality of layers of $Al_yGa_{(1-y)}As$.

For example, the first cavity 231 may include a first-first cavity layer 231a and a first-second cavity layer 231b. The first-first cavity layer 231a may be further spaced apart from the active layer 232 compared to the first-second cavity layer 231b. The first-first cavity layer 231a may be formed to be thicker than the first-second cavity layer 231b, but is not limited thereto.

In addition, the second cavity 233 may include a second-first cavity layer 233a and a second-second cavity layer 233b. The second-second cavity layer 233b may be further spaced apart from the active layer 232 compared to the second-first cavity layer 233a. The second-second cavity layer 233b may be formed to be thicker than the second-first cavity layer 233a, but is not limited thereto. In this case, the second-second cavity layer 233b may be formed to be about 60 to 70 nm, and the first-first cavity layer 231a may be formed to be about 40 to 55 nm, but are not limited thereto.

<Aperture Area>

Referring back to FIG. 5, in the embodiment, the aperture region 240 may include an insulating region 242 and an aperture 241. The aperture 241 may be referred to as an opening, and the aperture region 240 may be referred to as an opening region.

The insulating region 242 may be formed of an insulating layer, for example, aluminum oxide, and may function as a current blocking region, and an aperture 241 that is a light emission region may be defined by the insulating region 242.

For example, when the aperture region 240 includes aluminum gallium arsenide (AlGaAs), as AlGaAs of the aperture region 240 reacts with $H_2O$, the edge changes to aluminum oxide ($Al_2O_3$). An insulating region 242 may be formed, and a central region that does not react with $H_2O$ may be an aperture 241 made of AlGaAs.

According to the embodiment, light emitted from the active layer 232 through the aperture 241 may be emitted to the upper region, and the aperture 241 may have excellent light transmittance compared to the insulating region 242.

Referring to FIG. 6 for a moment, the insulating region 242 may include a plurality of layers, for example, the insulating region 242 includes a first insulating layer 242a and a second insulating layer 242b. The first insulating layer 242a may have a thickness equal to or different from that of the second insulating layer 242b.

<Second Electrode, Passivation Layer>

Referring back to FIG. 5, the surface emitting laser device 201 according to the embodiment may be mesa etched from the second reflective layer 250 to the aperture region 240 and the active layer 232 to define an emitter. In addition, even a part of the first reflective layer 220 may be mesa etched.

Thereafter, the second electrode 280 may be disposed on the second reflective layer 250, and the second electrode 280 may include a pad electrode 282 and a contact electrode 284. The contact electrode 284 may improve ohmic contact characteristics between the second reflective layer 250 and the pad electrode 282.

The second electrode 280 may be made of a conductive material, and may be, for example, a metal. For example, the second electrode 280 may include at least one of aluminum (Al), titanium (Ti), chromium (Cr), nickel (Ni), copper (Cu), and gold (Au) and can be formed into a structure. The contact electrode 284 may be formed of the same material as the material of the pad electrode 282, but is not limited thereto.

The embodiment may include a passivation layer 270 disposed on the second reflective layer 250.

For example, the passivation layer 270 may be disposed on side surfaces and upper surfaces of the mesa-etched light emitting structure. The passivation layer 270 may be disposed on a side surface of the surface emitting laser device 201 separated by device units, to protect and insulate the surface emitting laser device 201. The passivation layer 270 may be made of an insulating material, for example, a nitride or an oxide. For example, the passivation layer 270 may include at least one of polyimide, silica ($SiO_2$), or silicon nitride ($Si_3N_4$).

On the other hand, the technical problem to be solved in the embodiment is to provide a surface emitting laser device and a light emitting device including the same, capable of improving interfacial characteristics.

In addition, the technical problem of the embodiment is to provide a surface emitting laser device and a light emitting device including the same, capable of improving light-emitting characteristics.

FIG. 7 is an energy band diagram E1 of the active layer 232 of the surface emitting laser device according to the first embodiment shown in FIG. 5.

In the surface emitting laser device according to the first embodiment, the active layer 232 may include a plurality of quantum wells 232a and quantum barriers 232b, and an intermediate layer 232c disposed between the quantum wells 232a and the quantum barriers 232b. In FIG. 7, the energy band diagram E1 of the first embodiment including the intermediate layer 232c is shown, and the band diagram REF of the comparative example not including the intermediate layer is also shown.

As described above with reference to FIGS. 1 and 2A and 2B, in the related art, due to the phase separation of the InAlAs alloy, the growth (G) of deviating from the design value (D) different from the composition design value (D) happens. This causes a problem of deterioration of interfacial properties due to inter-mixing between materials of the quantum well and the quantum wall, leading to a decrease in luminous efficiency and reliability. For example, there is a problem in that high-temperature reliability for thermal characteristics is deteriorated, so that the slope efficiency of the light output (Po) is deteriorated.

In addition, in the related art, there is a problem in that peak intensity is lowered due to an increase in the full width at half maximum (FWHW) due to inter-mixing between the material of the quantum well and the quantum barrier in the active layer.

To solve this problem, in the active layer 232 of the embodiment, the quantum well 232a and the quantum barrier 232b may be composed of a ternary material, and the intermediate layer 232c may be composed of a binary material.

The material of the intermediate layer 232c may include a material included in the quantum barrier 232b and the quantum well 232a.

For example, the quantum well 232a includes an $In_xGa_{1-x}As$ layer (0<x<1), and the quantum barrier 232b includes an $Al_yGa_{1-y}As$ layer (0<y<1). In addition, the intermediate layer 232c may include a GaAs layer, but is not limited thereto. Accordingly, in the embodiment, the active layer 232 may have a superlattice structure of an $In_xGa_{1-x}As$ layer/GaAs layer/$Al_yGa_{1-y}As$ layer, but is not limited thereto.

In an embodiment, the bandgap energy level of the intermediate layer 232c may be higher than the bandgap energy level of the quantum well 232a and lower than the bandgap energy level of the quantum barrier 232b.

FIG. 8A is a full width at half maximum and intensity data of a surface emitting laser device according to a comparative example, and FIG. 8B is a full width at half maximum and intensity data of a surface emitting laser device according to an embodiment, in each active layer (MQW) which are based on PL (Photo Luminance).

According to the embodiment, the full width at half maximum FWHM may be controlled to be 10 nm or less based on the PL in the active layer MQW. For example, according to the embodiment, the full width at half maximum (FWHM) may be controlled in the range of 10 nm or less to 7.0 nm based on the PL in the active layer MQW.

For example, referring to FIG. 8A, the full width at half maximum (FWHM) in comparison is about 18.5 nm, while referring to FIG. 8B, the full width at half maximum (FWHM) is significantly reduced to 8.3 nm, and the peak intensity is also increased by about 7 times (7.355=>47.509).

According to the embodiment, the active layer 232 prevents phase separation by interposing an intermediate layer 232c, which is a binary material, between the quantum well 232a and the quantum barrier 232b. There is a technical effect that can significantly improve the peak intensity by preventing inter-mixing and significantly reducing the full width at half maximum (FWHW).

In addition, according to the embodiment, inter-mixing between the material of the quantum well and the quantum barrier can be prevented by interposing an intermediate layer 232c, which is a binary material, between the quantum well 232a and the quantum barrier 232b. So, there is a technical effect of improving the high-temperature reliability for thermal characteristics, thereby improving the slope efficiency of the light output (Po).

In addition, FIG. 9A is a TEM photograph of an active layer of a surface emitting laser device according to a comparative example, and FIG. 9B is a TEM photograph of an active layer of a surface emitting laser device according to an embodiment.

According to the embodiment (see FIG. 9B), unlike the comparative example by interposing an intermediate layer, which is a binary material, between the quantum well and the quantum barrier, thereby preventing inter-mixing between the material of the quantum well and the quantum barrier (see FIG. 9a) such that a clearer TEM image can be obtained.

FIG. 10 is peak intensity data based on the PL measurement result in the surface emitting laser device according to the embodiment, and is the result of three test runs performed in the MOCVD equipment.

For example, the sample of the embodiment is a test PL measurement result in which the GaAs intermediate layer 232c is inserted between the InGaAs quantum well 232a and the AlGaAs quantum wall 232b, but it is not limited thereto.

In an embodiment, the thickness of the quantum well 232a may be 4 nm to 7 nm, and the thickness of the quantum barrier 232b may be 4 nm to 7 nm.

The thickness of the intermediate layer 232c may range from 5% to 50% of the thickness of the quantum well 232a. For example, the thickness of the intermediate layer 232c may range from 7% to 40% of the thickness of the quantum well 232a, but is not limited thereto. For example, the thickness of the intermediate layer 232c may range from 7.14% to 32.5% of the thickness of the quantum well 232a, but is not limited thereto.

For example, in the active layer 232 of the embodiment, the thickness of the intermediate layer 232c of the binary material interposed between the quantum well 232a and the quantum barrier 232b may be about 0.5 nm to 1.3 nm.

In the embodiment, the thickness of the inserted GaAs intermediate layer 232c may be 0.5 nm to 1.3 nm, and in the embodiment, the peak intensity value was increased by at least 2 times or more by the comparative example without the GaAs intermediate layer, and at most 7 times.

Hereinafter, with reference to FIGS. 11A to 11C, the technical effect of obtaining higher efficiency as the full width at half maximum (FWHM) is smaller will be described in more detail.

FIG. 11A is a light emission and emission characteristic data of an LED and a LASER, respectively, FIG. 11B is a relationship between an applied current and a gain spectrum for laser oscillation, and FIG. 11C is a relationship between a VCSEL spectrum and a PL spectrum.

Referring to FIG. 11A, the laser is stimulated emission differently from the LED, and thus, if the QW wavelength is in a spontaneous emission region, it cannot oscillate.

So, as shown in FIG. 11C, in the VCSEL, when the cavity mode and the gain spectrum coincide, the light of the VCSEL is emitted, and the gain is obtained in the active region, which can be confirmed as a QW peak.

In order for the laser to operate, an optical cavity is formed between two mirror surfaces (DBR) through which light can resonate, so that the laser can oscillate only when optical gain is obtained. The gain medium exceeds the transparency current of the active layer inside the laser and satisfies the inversion condition and the population inversion, and is an element that is not present in the LED. So, the laser needs a high current (more than Id) to make the inversion distribution.

It is determined at the gain peak at the highest point in the gain spectrum, which is a graph of the amount of gain according to the amount of current in the laser oscillation wavelength condition. Assuming that a region of more than $g_{th}$ in one gain spectrum is a region that can become a laser, a cavity mode is formed while mode spacing is performed in the cavity of the photon region that can become a laser of that region.

When a current of $I_{th}$ or more is applied, a gain is obtained in the active layer and is stimulated to emit laser light. At this time, the laser wavelength is determined by the wavelength of the cavity mode.

In the case of the VCSEL, the length of the cavity is short, so the mode spacing is as large as several hundred Å. So, in temperature change, the gain spectrum matches one mode, and the same wavelength laser comes out. Accordingly, the highest part of the QW peak is used for laser oscillation, and the rest are not oscillated and absorption areas occur. Therefore, the smaller the full width at half maximum (FWHM), the higher the efficiency can be obtained.

According to the embodiment, the active layer 232 prevents phase separation by interposing an intermediate layer 232c, which is a binary material, between the quantum well 232a and the quantum barrier 232b. There is a technical effect that can significantly improve the peak intensity by preventing inter-mixing and significantly reducing the full width at half maximum (FWHW).

In addition, according to the embodiment, inter-mixing between the material of the quantum well and the quantum barrier is prevented by interposing an intermediate layer 232c, which is a binary material, between the quantum well 232a and the quantum barrier 232b. So, there is a technical effect of improving the high-temperature reliability for thermal characteristics, thereby improving the slope efficiency of the light output (Po).

FIG. 12 is an energy band diagram of an active layer of a surface emitting laser device according to a second embodiment.

The second embodiment can adopt the technical features of the first embodiment.

For example, in the second embodiment, the active layer 232 may include a plurality of quantum wells 232a and quantum barriers 232b, and an intermediate layer 232c disposed between the quantum well and the quantum barrier.

The quantum well 232a and the quantum barrier 232b may be made of a ternary material, and the intermediate layer 232c may be made of a binary material.

In the second embodiment, the quantum barrier 232b of the active layer 232 may have a superlattice structure of the first quantum barrier layer 232b1 and the second quantum barrier layer 232b2.

For example, in the quantum barrier 232b, the first quantum barrier layer 232b1 may include an $Al_yGa_{1-y}As$ layer (0<y<1), and the second quantum barrier layer 232b2 may include an $In_zAl_yGa_{1-y-z}As$ layer (0<y<1, 0<z<1).

Through this, in the embodiment, the quantum barrier 232b may have a superlattice structure of an $Al_yGa_{1-y}As$ layer/$In_zAl_yGa_{1-y-z}As$ layer, but is not limited thereto. Through this, optical characteristics can be improved.

Next, one of the technical problems of the embodiment is to provide a surface emitting laser device and a light emitting device including the same, capable of improving electrical characteristics.

FIG. 13A is a first energy band diagram for a first region 250S of a second reflective layer of a surface emitting laser device according to an embodiment, and is illustrated based on an Al composition.

The following description will be described centering on the second reflective layer 250, but the technical features of the embodiment may be applied to the first reflective layer 220 as well.

First, referring to FIG. 13A, the second reflective layer 251 of the first group of the embodiment may include a plurality of layers. For example, the second reflective layer 251 of the first group of the embodiment may include a first AlGaAs-based layer 251a and a second AlGaAs-based layer 251b, and a grading AlGaAs-based layer 251m therebetween.

According to the embodiment, a grading AlGaAs-based layer 251m having an aluminum concentration in an intermediate region is provided between the adjacent first AlGaAs-based layer 251a and the second AlGaAs-based layer 251b. There is a technical effect of improving light output by lowering a carrier barrier by minimizing the generation of an electric field due to energy band bending.

For example, when the first group second reflective layer 251 includes $Al_xGa_{(1-x)}As$ (0<x<1), the first group second reflective layer 251 can include a first AlGaAs-based layer 251a including $Al_{x1}Ga_{(1-x1)}As$ (however, 0<X1<0.2), a second AlGaAs-based layer 251b including $Al_{x2}Ga_{(x-x2)}As$ (however, 0.8<X2<1.0) and a grading AlGaAs-based layer 251m including $Al_{y1}Ga_{(1-y1)}As$ (however, X1<y1<X2) disposed between the first AlGaAs-based layer 251a and the second AlGaAs-based layer 251b.

Accordingly, the embodiment may include a grading AlGaAs-based layer 251m having an aluminum concentration in an intermediate region between the adjacent first AlGaAs-based layer 251a and the second AlGaAs-based layer 251b. Therefore, there is a technical effect of improving light output by reducing a carrier barrier by minimizing the generation of an electric field due to energy band bending at an interface between adjacent reflective layers.

Accordingly, according to the embodiment, it is possible to provide a surface emitting laser device and a light emitting device including the same, capable of improving light output by minimizing the influence of a carrier quantum barrier due to generation of an electric field in a reflective layer.

On the other hand, one of the technical problems of the embodiment is to provide a surface emitting laser device and a light emitting device including the same, which can improve light efficiency by not generating thermal resistance while improving electrical properties.

Hereinafter, a technical feature of an embodiment capable of solving such a technical contradiction will be described.

First, FIG. 13B is data of thermal resistance according to the Al composition in the second reflective layer of the surface emitting laser device.

As described above, there have been attempts to lower the electrical resistance at the interface between the DBR layers according to the un-disclosed internal technology. However, such attempts have caused a problem of lowering the light efficiency due to the increase in thermal resistance in the DBR layer, resulting in a technical contradiction.

Specifically, the embodiment may include a grading AlGaAs-based layer 251m disposed between the first AlGaAs-based layer 251a and the second AlGaAs-based layer 251b, having an aluminum concentration in the middle region, and graded the Al composition. Accordingly, it is possible to improve light output by lowering the carrier barrier by minimizing the generation of an electric field due to bending of an energy band at an interface between adjacent reflective layers. In addition, there is a technical effect that can alleviate high resistance characteristics due to continuous band offset at the DBR interface.

However, the AlGaAs of the reflective layer, as shown in FIG. 13B, increases the thermal resistance due to alloy scattering in the Al composition (X) between 20% and 80% (see Xt region), and in particular, as the Al composition approaches 50%, it shows a characteristic that the thermal resistance increases rapidly.

That is, according to a un-disclosed internal technology, when a grading AlGaAs-based layer (251m) is inserted at the high/low refractive index interface to reduce the electrical resistance in the DBR layer, the Al composition is scattered in the range of about 20 to 80% (Xt) such that the heat resistance can increase due to alloy scattering. Accordingly, according to the application of the graded AlGaAs-based layer (251m) inserted to reduce electrical resistance, there is a technical contradiction in which optical efficiency is lowered due to the generation of thermal resistance.

FIG. 14A is a partially enlarged view of a second reflective layer of a surface emitting laser device according to an embodiment, showing Al composition data according to thickness, and FIG. 14B is a surface emitting laser device according to an embodiment and optical power data according to an applied current of a comparative example.

In order to solve the technical contradiction described above, as shown in FIG. 14A, the second reflective layer 250 of the embodiment may include an AlGaAs-based transition region 251t disposed between the first AlGaAs-based layer 251a and the second AlGaAs-based layer 251b.

According to the embodiment, since the AlGaAs-based transition region 251t having low or no thermal resistance is provided, thermal resistance may not be generated while improving electrical characteristics. Accordingly, it is possible to provide a surface emitting laser device and a light emitting device including the same having a complex technical effect that can also improve light efficiency.

Specifically, the second reflective layer 250 of the embodiment may include a first AlGaAs-based layer 251a including $Al_{x1}Ga_{(1-x1)}As$ (however, 0<X1<0.2), and a second AlGaAs-based layer 251b including $Al_{x2}Ga_{(1-x2)}As$ (however, 0.8<X2<1.0) disposed on the first AlGaAs-based layer 251a, and an AlGaAs based transition region 251t disposed between the first AlGaAs-based layer 251a and the second AlGaAs-based layers 251b.

In this case, the AlGaAs-based transition region 251t may include a third AlGaAs-based layer 251c including $Al_{x3}Ga_{(1-x3)}As$ (however, 0<X3<0.2) and a fourth AlGaAs-based layer 251d including $Al_{x4}Ga_{(1-x4)}As$ (however, 0.8<X4<1.0). And the third AlGaAs-based layer 251c and the fourth AlGaAs-based layer 251d are alternately formed of a plurality of layers.

In an embodiment, the Al concentration X3 of the third AlGaAs-based layer 251c may be equal to or higher than the Al concentration X1 of the first AlGaAs-based layer 251a.

In addition, the Al concentration (X1) of the first AlGaAs-based layer 251a and the Al concentration (X3) of the third AlGaAs-based layer 251c may be 8% to 20%.

In addition, the Al concentration X4 of the fourth AlGaAs-based layer 251d may be equal to or lower than the Al concentration X3 of the second AlGaAs-based layer 251b.

In addition, the Al concentration X4 of the fourth AlGaAs-based layer 251d and the Al concentration X2 of the second AlGaAs-based layer 251b may be 80% to 92%.

According to an embodiment, the Al concentration (X3) of the third AlGaAs-based layer 251c is higher than the Al concentration (X1) of the first AlGaAs-based layer 251a, but controlled to 20% or less, thereby preventing causing thermal resistance. In addition, the Al concentration (X4) of the fourth AlGaAs-based layer 251d is lower than the Al concentration (X2) of the second AlGaAs-based layer 251b and is controlled to 80% or more, thereby preventing generating thermal resistance.

For example, in the embodiment, the AlGaAs-based transition region 251t may include a third AlGaAs-based layer 251c of $Al_{x3}Ga_{(1-x3)}As$ (however, X1<X3<0.2) having low thermal resistance and a fourth AlGaAs-based layer 251d of $Al_{x4}Ga_{(1-x4)}As$ (however, 0.8<X4<X2) having low thermal resistance. And since the AlGaAs-based transition region 251t is disposed between the first AlGaAs-based layer 251a and the second AlGaAs-based layers 251b, the heat resistance is not generated and there is a complex technical effect capable of improving optical efficiency and improving electrical characteristics.

For example, in the high current region of 2,000 mA to 2,500 mA or more as shown in FIG. 14B, optical power is significantly lowered due to the generation of thermal resistance as in Comparative Example (R). According to embodiment (E), the AlGaAs based transition region 251t is disposed between the first AlGaAs-based layer 251a and the second AlGaAs-based layer 251b so that thermal resistance is not generated, thereby improving optical efficiency and improving electrical characteristics.

Referring back to FIG. 14A, according to an embodiment, the concentration X3 of Al in the third AlGaAs-based layer 251c may be controlled to 12% to 20% or less. Through this, the Al concentration (X3) of the third AlGaAs-based layer 251c is controlled to be 20% or less so that thermal resistance can be prevented, and the Al concentration of the third AlGaAs-based layer 251c (X3) is controlled to be 12% or more and is controlled to be higher than the Al concentration (X1) of the first AlGaAs-based layer 251a, thereby minimizing the difference with the Al concentration (X4) of the fourth AlGaAs-based layer 251d to be formed thereafter. There is a technical effect of maintaining or improving crystal quality or electrical resistance characteristics while lowering the thermal resistance.

In addition, the Al concentration X4 in the fourth AlGaAs-based layer 251d may be controlled to 80% to 88% or less. Through this, the Al concentration (X4) of the fourth AlGaAs-based layer 251d can be controlled to be 80% or more, thereby preventing thermal resistance from being induced, and the Al concentration of the fourth AlGaAs-based layer 251d (X4) is controlled to be less than 88% and is controlled to be lower than the Al concentration (X4) of the fourth AlGaAs-based layer 251d, thereby minimizing the difference with the Al concentration (X3) of the third AlGaAs-based layer 251c to be formed thereafter. There is a technical effect of maintaining or improving crystal quality or electrical resistance characteristics while lowering the thermal resistance.

FIG. 14A, the thickness of the AlGaAs-based transition region 251t in the second reflective layer 250 is thinner than each of the first AlGaAs-based layer 251a and the second AlGaAs-based layer 251b. That is, the thickness of each of the first AlGaAs-based layer 251a and the second AlGaAs-based layer 251b may be thicker than the thickness of the AlGaAs-based transition region 251t.

For example, each of the first AlGaAs-based layer 251a and the second AlGaAs-based layer 251b may have a thickness in a range of 2 to 3 times that of the AlGaAs-based transition region 251t.

For example, the thickness of the AlGaAs-based transition region 251t may be about 15 nm to 28 nm, and the thickness of each of the first AlGaAs-based layer 251a and the second AlGaAs-based layer 251b is about 30 nm to 84 nm, but is not limited thereto.

According to an embodiment, the thickness of the AlGaAs-based transition region 251t is formed to be thinner than each of the first AlGaAs-based layer 251a and the second AlGaAs-based layer 251b such that by minimizing the generation of resistance, there is a technical effect of improving light efficiency and improving electrical characteristics.

In addition, in an embodiment, the plurality of third AlGaAs-based layers 251c may be thinner in a direction from the first AlGaAs-based layer 251a to the second AlGaAs-based layer 251b.

In addition, the first thickness T1 of the plurality of third AlGaAs-based layers 251c may gradually decrease from the first AlGaAs-based layer 251a to the second AlGaAs-based layer 251b.

For example, the plurality of third AlGaAs-based layers 251c include a third-first AlGaAs-based layer 251c1, a third-second AlGaAs-based layer 251c2, a third-third AlGaAs-based layer 251c3, and a third-fourth AlGaAs-based layer 251c4, and formed of 4 nm or less, for example, 4 nm, 3 nm, 2 nm, and 1 nm, respectively, to maximize the tunneling effect, thereby obtaining complex technical effects such as reducing the electrical resistance and reducing the thermal resistance.

In addition, the plurality of fourth AlGaAs-based layers 251d may be thinner in a direction from the second AlGaAs-based layer 251b to the first AlGaAs-based layer 251a.

In addition, the second thickness T2 of the plurality of fourth AlGaAs-based layers 251d may gradually decrease from the second AlGaAs-based layer 251b toward the first AlGaAs-based layer 251a.

For example, the plurality of fourth AlGaAs-based layers 251d include a fourth-first AlGaAs-based layer 251d1, a fourth-second AlGaAs-based layer 251d2, a fourth-third AlGaAs-based layer 251d3, and a fourth-fourth AlGaAs-based layer 251d4, and formed of 4 nm or less, for example, 1 nm, 2 nm, 3 nm, and 4 nm, respectively, thereby obtaining complex technical effects such as maximizing the tunneling effect to reduce electrical resistance and thermal resistance.

In the embodiment, each of the third AlGaAs-based layer 251c and the fourth AlGaAs-based layer 251d may form one pair and may form 3 to 4 pairs, and the thickness of one pair can be controlled to be less than the Bohr radius of 3 nm to 4 nm to maximize the tunneling effect.

Through this, according to the embodiment, it is possible to maximize the tunneling effect to obtain a complex technical effect of the effect of reducing the electrical resistance and the effect of reducing the thermal resistance.

FIG. 15 is another cross-sectional view of a surface emitting laser device according to an embodiment.

In addition to the vertical type, the surface emitting laser device according to the embodiment may have a flip chip type in which the first electrode 215 and the second electrode 280 have the same direction as shown in FIG. 15.

For example, as shown in FIG. 15, the surface emitting laser device according to another embodiment may include a first electrode 215, a substrate 210, a first reflective layer 220, an active layer 232, an aperture region 240, a reflective layer 250, a second electrode 280, a first passivation layer 271, a second passivation layer 272, and a non-reflective layer 290. In this case, the reflectivity of the second reflective layer 250 may be designed to be higher than that of the first reflective layer 220.

At this time, the first electrode 215 may include a first contact electrode 216 and a first pad electrode 217, and a first contact electrode 216 may be electrically connected, and the first pad electrode 217 may be electrically connected to the first contact electrode 216.

The first electrode 215 may be made of a conductive material, and may be, for example, a metal. For example, the first electrode 215 includes at least one of aluminum (Al), titanium (Ti), chromium (Cr), nickel (Ni), copper (Cu), and gold (Au) and can be formed into a structure.

When the first reflective layer 220 is an n-type reflective layer, the first electrode 215 may be an electrode for the n-type reflective layer.

Next, the second electrode 280 may include a second contact electrode 282 and a second pad electrode 284, and the second contact electrode 282 is electrically connected to the second reflective layer 250. Then, the second pad electrode 284 may be electrically connected to the second contact electrode 282.

When the second reflective layer 250 is a p-type reflective layer, the second electrode 280 may be an electrode for the p-type reflective layer.

The first insulating layer 271 and the second insulating layer 272 may be made of an insulating material, for example, at least one of nitride or oxide, polyimide, silica ($SiO_2$), or silicon nitride ($Si_3N_4$).

INDUSTRIAL APPLICABILITY (Mobile Terminal)

Next, FIG. 16 is a perspective view of a mobile terminal to which a surface emitting laser device is applied according to an embodiment.

As shown in FIG. 16, the mobile terminal 1500 according to the embodiment may include a camera module 1520, a flash module 1530, and an autofocus device 1510 provided on the rear side. Here, the autofocus device 1510 may include one of the packages of the surface emitting laser device according to the above-described embodiment as a light emitting unit.

The flash module 1530 may include a light emitting device that emits light therein. The flash module 1530 may be operated by a camera operation of a mobile terminal or a user's control.

The camera module 1520 may include an image capturing function and an auto focus function. For example, the camera module 1520 may include an auto focus function using an image.

The auto focus device 1510 may include an auto focus function using a laser. The autofocus device 1510 may be mainly used in a condition in which an autofocus function using an image of the camera module 1520 is deteriorated, for example, in a proximity or dark environment of 10 m or less. The auto-focusing device 1510 may include a light-emitting unit including the surface emitting laser device of the above-described embodiment, and a light-receiving unit that converts light energy such as a photodiode into electrical energy.

Features, structures, effects, and the like described in the embodiments above are included in at least one embodiment, and are not necessarily limited to only one embodiment. Furthermore, the features, structures, effects, and the like illustrated in each embodiment may be combined or modified for other embodiments by a person having ordinary knowledge in the field to which the embodiments belong. Therefore, the contents related to these combinations and modifications should be construed as being included in the scope of the embodiment.

Although the embodiments have been described above, these are only examples and are not intended to limit the embodiments, and those of ordinary skill in the field to which the embodiments belong to various types not illustrated above without departing from the essential characteristics of the present embodiment. It will be seen that branch transformation and application are possible. For example, each component specifically shown in the embodiment can be modified and implemented. And differences related to these modifications and applications should be construed as being included in the scope of the embodiments set in the appended claims.

The invention claimed is:

1. A surface emitting laser device comprising:
a first reflective layer;
an active layer disposed on the first reflective layer;
an aperture region disposed on the active layer and including an aperture and an insulating region; and
a second reflective layer disposed on the aperture region,
wherein the active layer includes a plurality of quantum wells interleaved with a plurality of quantum barriers, and an intermediate layer disposed between each quantum well-quantum barrier pair of the plurality of quantum wells and quantum barriers,
wherein the quantum wells and the quantum barriers are composed of a ternary material respectively,
wherein the intermediate layer is composed of a binary material, and
wherein the second reflective layer comprises:
a first AlGaAs-based layer including $Al_{x1}Ga_{(1-x1)}As$ (where 0<X1<0.2);
a second AlGaAs-based layer disposed on the first AlGaAs-based layer and including $Al_{x2}Ga_{(1-x2)}As$ (where, 0.8<X2<1.0); and
an AlGaAs-based transition region disposed between the first AlGaAs-based layer and the second AlGaAs-based layer.

2. The surface emitting laser device according to claim 1, wherein the material of the intermediate layer comprises a material included in the quantum barrier and the quantum well.

3. The surface emitting laser device according to claim 2, wherein the quantum well comprises an $In_xGa_{1-x}As$ layer (0<x<1), the quantum barrier comprises an $Al_yGa_{1-y}As$ layer (0<y<1), and the intermediate layer comprises a GaAs layer.

4. The surface emitting laser device according to claim 1, wherein a thickness of the intermediate layer in the active layer is 7% to 40% of a thickness of the quantum well, and
wherein a thickness of the intermediate layer of the binary material interposed between the quantum well and the quantum barrier in the active layer is 0.5 nm to 1.3 nm.

5. The surface emitting laser device according to claim 1, wherein the active layer has a half-width (FWHM) of 10 nm to 7.0 nm based on a photo luminance (PL) value, and
wherein a band gap energy level of the intermediate layer is higher than a band gap energy level of the quantum well, and is lower than a bandgap energy level of the quantum barrier.

6. The surface emitting laser device according to claim 2, wherein the active layer has a superlattice structure including an $In_xGa_{1-x}As$ layer/GaAs layer/$Al_yGa_{1-y}As$ layer.

7. The surface emitting laser device according to claim 1, wherein the quantum barrier of the active layer has a superlattice structure of a first quantum barrier layer and a second quantum barrier layer, and
wherein in the quantum barrier, the first quantum barrier layer comprises an $Al_yGa_{1-y}As$ layer (0<y<1) and the second quantum barrier layer comprises an $In_zAl_yGa_{1-y-z}As$ layer (0<y<1, 0<z<1).

8. The surface emitting laser device according to claim 1, wherein the AlGaAs-based transition region comprises a third AlGaAs-based layer including $Al_{x3}Ga_{(1-x3)}As$ (where 0<X3<0.2); and a fourth AlGaAs-based layer including $Al_{x4}Ga_{(1-x4)}As$ (however, 0.8<X4<1.0);
wherein, the third AlGaAs-based layer and the fourth AlGaAs-based layer are alternately disposed as a plurality of layers,
wherein thickness of the plurality of third AlGaAs-based layers become thinner in a direction from the first AlGaAs-based layer to the second AlGaAs-based layer, and
wherein thickness of the plurality of fourth AlGaAs-based layers become thinner thickness in the direction from the second AlGaAs-based layer to the first AlGaAs-based layer.

9. A light emitting device comprising the surface emitting laser device according to claim 1.

10. The surface emitting laser device according to claim 1, wherein the quantum barrier comprises a superlattice structure of an $Al_yGa_{1-y}As$ layer/$In_zAl_yGa_{1-y-z}As$ layer.

11. The surface emitting laser device according to claim 1, wherein the AlGaAs-based transition region includes a grading AlGaAs-based layer therebetween.

12. The surface emitting laser device according to claim 11, wherein the grading AlGaAs-based layer having an aluminum concentration in an intermediate region is provided between the adjacent first AlGaAs-based layer and the second AlGaAs-based layer.

13. The surface emitting laser device according to claim 12, wherein the grading AlGaAs-based layer includes $Al_{y1}Ga_{(1-y1)}As$, where X1<Y1<X2, disposed between the first AlGaAs-based layer and the second AlGaAs-based layer.

14. The surface emitting laser device according to claim 8, wherein an Al concentration X3 of the third AlGaAs-based layer is equal to or higher than the Al concentration X1 of the first AlGaAs-based layer.

15. The surface emitting laser device according to claim 8, wherein the Al concentration X1 of the first AlGaAs-based layer and the Al concentration X3 of the third AlGaAs-based layer are 8% to 20%, respectively.

16. The surface emitting laser device according to claim 8, wherein the Al concentration X4 of the fourth AlGaAs-based layer is equal to or lower than the Al concentration X3 of the second AlGaAs-based layer.

17. The surface emitting laser device according to claim 8, wherein the Al concentration X4 of the fourth AlGaAs-based layer and the Al concentration X2 of the second AlGaAs-based layer are 80% to 92%, respectively.

18. The surface emitting laser device according to claim 8, wherein the concentration X3 of Al in the third AlGaAs-based layer is 12% to 20%.

19. The surface emitting laser device according to claim 1, wherein a thickness of the AlGaAs-based transition region is thinner than each of the first AlGaAs-based layer and the second AlGaAs-based layer.

* * * * *